(12) United States Patent
Wang et al.

(10) Patent No.: US 9,703,415 B2
(45) Date of Patent: Jul. 11, 2017

(54) TOUCH PANEL, TOUCH POSITIONING METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Haisheng Wang, Beijing (CN); Xue Dong, Beijing (CN); Hailin Xue, Beijing (CN); Shengji Yang, Beijing (CN); Xiaoliang Ding, Beijing (CN); Yingming Liu, Beijing (CN); Weijie Zhao, Beijing (CN); Hongjuan Liu, Beijing (CN); Changfeng Li, Beijing (CN); Wei Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/770,983

(22) PCT Filed: Jan. 4, 2015

(86) PCT No.: PCT/CN2015/070046
§ 371 (c)(1),
(2) Date: Aug. 27, 2015

(87) PCT Pub. No.: WO2016/041301
PCT Pub. Date: Mar. 24, 2016

(65) Prior Publication Data
US 2016/0364060 A1    Dec. 15, 2016

(30) Foreign Application Priority Data
Sep. 19, 2014  (CN) .......................... 2014 1 0484054

(51) Int. Cl.
G06F 3/044 (2006.01)
G06F 3/041 (2006.01)
(Continued)

(52) U.S. Cl.
CPC .......... G06F 3/0416 (2013.01); G02F 1/1333 (2013.01); G06F 3/044 (2013.01);
(Continued)

(58) Field of Classification Search
CPC ...... G06F 3/0416; G06F 3/0412; G06F 3/044; G06F 2203/04104; H01L 27/323;
(Continued)

(56) References Cited

U.S. PATENT DOCUMENTS

2006/0097991 A1   5/2006   Hotelling et al.
2009/0314621 A1*  12/2009  Hotelling .............. G06F 3/0416
                                                    200/600
(Continued)

FOREIGN PATENT DOCUMENTS

CN   103309522 A   9/2013
CN   103631463 A   3/2014
(Continued)

OTHER PUBLICATIONS

Korean Office Action dated Aug. 20, 2016; Appln. No. 10-2015-7024526.
(Continued)

Primary Examiner — Ibrahim Khan
(74) Attorney, Agent, or Firm — Ladas & Parry LLP

(57) ABSTRACT

A touch panel, a touch positioning method thereof and a display device are provided. In the touch panel, a plurality of self-capacitive electrodes are divided into several self-capacitive electrode groups independent of each other and several independent self-capacitive electrodes; each of the self-capacitive electrode groups includes at least two self-
(Continued)

capacitive electrodes not adjacent to each other, and the respective self-capacitive electrodes in a same self-capacitive electrode group are electrically connected with a touch chip through a same wire, and at least the self-capacitive electrodes located on the four adjacent positions of upper, lower, left and right sides of the respective self-capacitive electrodes in the respective self-capacitive electrode groups are independent self-capacitive electrodes. The touch panel has a decreased number of wires for electrically connecting the self-capacitive electrodes with the touch chip, and a decreased number of lead-out wires of the touch panel and a decreased number of wiring terminals of the touch chip.

20 Claims, 18 Drawing Sheets

(51) Int. Cl.
  G02F 1/1333 (2006.01)
  G02F 1/1343 (2006.01)
  G02F 1/1362 (2006.01)
  H01L 27/32 (2006.01)
(52) U.S. Cl.
  CPC ........ *G06F 3/0412* (2013.01); *G02F 1/13338* (2013.01); *G02F 1/13439* (2013.01); *G02F 1/134336* (2013.01); *G02F 1/136286* (2013.01); *G02F 2201/121* (2013.01); *G06F 2203/04104* (2013.01); *H01L 27/323* (2013.01)
(58) Field of Classification Search
  CPC ......... G02F 1/134336; G02F 2201/121; G02F 1/136286; G02F 1/13439; G02F 1/13338
  See application file for complete search history.

(56) References Cited

U.S. PATENT DOCUMENTS

| | | | | |
|---|---|---|---|---|
| 2010/0007631 | A1* | 1/2010 | Chang | G06F 3/044 345/174 |
| 2010/0090979 | A1* | 4/2010 | Bae | G06F 3/044 345/174 |
| 2011/0279409 | A1* | 11/2011 | Salaverry | G06F 3/0416 345/174 |
| 2012/0262419 | A1 | 10/2012 | Hershman et al. | |
| 2013/0002579 | A1* | 1/2013 | Hatano | G06F 3/0418 345/173 |
| 2013/0050116 | A1* | 2/2013 | Shin | G06F 3/044 345/173 |
| 2013/0234985 | A1* | 9/2013 | Huang | G06F 3/044 345/174 |
| 2013/0265271 | A1* | 10/2013 | Hsu | G06F 3/0418 345/174 |
| 2014/0192027 | A1* | 7/2014 | Ksondzyk | G01N 27/22 345/178 |
| 2014/0204058 | A1* | 7/2014 | Huang | G06F 3/0418 345/174 |
| 2014/0232682 | A1* | 8/2014 | Kim | G06F 3/044 345/174 |
| 2014/0362030 | A1* | 12/2014 | Mo | G06F 3/044 345/174 |
| 2014/0362033 | A1* | 12/2014 | Mo | G06F 3/0416 345/174 |
| 2014/0362034 | A1* | 12/2014 | Mo | G06F 3/044 345/174 |
| 2015/0091587 | A1* | 4/2015 | Shepelev | G06F 3/044 324/658 |
| 2015/0116263 | A1* | 4/2015 | Kim | G06F 3/044 345/174 |
| 2015/0261348 | A1* | 9/2015 | Jang | G06F 3/044 345/174 |
| 2015/0287381 | A1* | 10/2015 | Kim | G06F 3/044 345/174 |
| 2015/0317008 | A1* | 11/2015 | Chandran | G06F 3/044 345/174 |
| 2016/0026290 | A1 | 1/2016 | Liu et al. | |
| 2016/0147340 | A1* | 5/2016 | Lee | G06F 3/044 345/174 |

FOREIGN PATENT DOCUMENTS

| | | |
|---|---|---|
| CN | 103793121 A | 5/2014 |
| CN | 103838430 A | 6/2014 |
| CN | 103970392 A | 8/2014 |
| CN | 104020905 A | 9/2014 |
| CN | 104020907 A | 9/2014 |
| CN | 104020908 A | 9/2014 |
| JP | 2012-208749 A | 10/2012 |
| JP | 2013-246833 A | 12/2013 |
| KR | 1020130069089 A | 6/2013 |
| KR | 20140083214 A | 7/2014 |
| KR | 1020150108003 A | 9/2015 |

OTHER PUBLICATIONS

International Search Report Appln. No. PCT/CN2015/070046; Dated Jun. 18, 2015.
Written Opinion of the International Searching Authority Appln. No. PCT/CN2015/070046: Dated Jun. 18, 2015.
Second Chinese Office Action dated Dec. 26, 2016; Appln. No. 201410484054.X.
First Chinese Office Action dated Sep. 26, 2016; Appln. No. 201410484054.X.
Korean Notice of Allowance dated Apr. 28, 2017; Appln. No. 10-2015-7024526.

\* cited by examiner

TOUCH PANEL, TOUCH POSITIONING METHOD THEREOF AND DISPLAY DEVICE

TECHNICAL FIELD

Embodiments of the invention relate to a touch panel, a touch positioning method thereof and a display device.

BACKGROUND

Along with rapid development of a display technology, a touch panel has been widely used in human life. Generally, in terms of composition structure, touch panels can be divided into: an add-on touch panel, an on-cell touch panel, and an in-cell touch panel. The add-on touch panel has a touch panel and a display panel (Liquid Crystal Display) separately produced and bonded together to form a display screen with a touch function. The add-on touch panel has many shortcomings such as high production cost, low light transmittance, and thick module and so on. The in-cell touch panel is to embed touch electrodes of the touch panel in a display screen, which not only reduces overall thickness of the module, but also greatly reduces production cost of the touch panel, and thus is favored by panel manufacturers.

Generally, the in-cell touch panel is to detect a finger touch position by using the principle of mutual-capacitance or self-capacitance. For example, a plurality of self-capacitive electrodes arranged in a same layer and insulated from each other can be arranged in a touch panel by using the principle of self-capacitance. When a human body does not touch the screen, capacitances of respective self-capacitive electrodes are a constant value; when the human body touches the screen, the capacitance of corresponding self-capacitive electrode is a sum of the constant value and the capacitance of human body. A touch chip can determine a touch position by detecting changes in capacitance values of respective self-capacitive electrodes during a touch period. As compared with mutual-capacitive touch panel where the capacitance of human body can only act on a projected capacitance, the capacitance of human body can act on all the self-capacitances in self-capacitive touch panel, and thus touch changes caused by touching the screen by the human body are greater than that of a touch panel fabricated by using the principle of mutual-capacitance. Therefore, the self-capacitive touch panel can effectively improve a signal-to-noise ratio of touch, so that accuracy of touch sensing is improved.

SUMMARY OF THE INVENTION

Embodiments of the present invention provide an in-cell touch panel and a display device, which can reduce lead-out wires of the touch panel without reducing self-capacitive electrodes.

At least an embodiment of the present invention provides a touch panel, comprising a base substrate, a plurality of self-capacitive electrodes arranged in matrix and located on the base substrate, and a touch chip for determining a touch position by detecting changes in capacitance values of the respective self-capacitive electrodes during a touch period. The plurality of self-capacitive electrodes are divided into several self-capacitive electrode groups independent of each other and several independent self-capacitive electrodes; each of the independent self-capacitive electrodes is one of the self-capacitive electrodes respectively, and the respective independent self-capacitive electrodes are electrically connected with the touch chip through different wires; each of the self-capacitive electrode groups includes at least two self-capacitive electrodes not adjacent to each other, and the respective self-capacitive electrodes in a same self-capacitive electrode group are electrically connected with the touch chip through a same wire, and at least self-capacitive electrodes located on the four adjacent positions of upper, lower, left and right sides of the respective self-capacitive electrodes in the respective self-capacitive electrode groups are independent self-capacitive electrodes.

For example, each of the self-capacitive electrode groups can include at least two self-capacitive electrodes not adjacent to each other along a column direction or a row direction.

For example, the respective self-capacitive electrodes in the same self-capacitive electrode group can be separated from each other by one independent self-capacitive electrode.

For example, each of the self-capacitive electrode groups can consist of two of the self-capacitive electrodes.

For example, self-capacitive electrodes located on the four adjacent positions of upper, lower, left and right sides of the respective independent self-capacitive electrodes can be the self-capacitive electrodes in the self-capacitive electrode group.

For example, the self-capacitive electrodes located on all the adjacent positions of the respective self-capacitive electrodes in the respective self-capacitive electrode groups can be independent self-capacitive electrodes.

For example, in order to reduce thickness of the touch panel, the respective self-capacitive electrodes can be formed by segmenting a common electrode layer arranged on the base substrate; the touch chip is further used for loading common electrode signals to respective self-capacitive electrodes during a display period.

For example, opposite side edges of two adjacent self-capacitive electrodes can be fold lines.

For example, the opposite side edges of two adjacent self-capacitive electrodes which are fold lines can have step-like structures consistent in shape and matching each other.

For example, the opposite side edges of two adjacent self-capacitive electrodes which are fold lines can have concave-convex structures consistent in shape and matching each other.

For example, the touch panel can be an add-on touch panel, an on-cell touch panel, or an in-cell touch panel.

An embodiment of the present invention further provides a touch positioning method of any touch panel described above, comprising: inputting touch detection signals to the self-capacitive electrodes during the touch panel; receiving feedback signals from the respective self-capacitive electrodes; according to the feedback signals, comparing capacitance values of the self-capacitive electrodes located on respective positions with a first predetermined capacitance value; and determining the position of the self-capacitive electrode with capacitance value greater than the first predetermined capacitance value as a first position; for each of the first positions, judging whether capacitance values of the self-capacitive electrodes located on the four adjacent positions of upper, lower, left and right sides of the first position are less than a second predetermined capacitance value; if at least two of the self-capacitive electrodes located on the four adjacent positions of the upper, lower, left and right sides of the first position have the capacitance values less than the second predetermined capacitance value, determining the first position as a ghost point position; determining the first position except for the ghost point position as the touch position.

For a touch panel in which self-capacitive electrodes located on all the adjacent positions of the respective self-capacitive electrodes in the respective self-capacitive electrode groups are independent self-capacitive electrodes, an embodiment of the present invention further provides a touch positioning method for the touch panel, comprising: inputting touch detection signals to the self-capacitive electrodes during the touch panel; receiving feedback signals from the respective self-capacitive electrodes; according to the feedback signals, comparing capacitance values of the self-capacitive electrodes located on respective positions with a first predetermined capacitance value; and determining the position of the self-capacitive electrode with capacitance value greater than the first predetermined capacitance value as a first position; for each of the first positions, judging whether capacitance values of the self-capacitive electrodes located on the adjacent positions of the first position are less than a second predetermined capacitance value; if at least half of the self-capacitive electrodes located on the adjacent positions of the first position have the capacitance values less than the second predetermined capacitance value, determining the first position as a ghost point position; determining the first position except for the ghost point position as the touch position.

An embodiment of the present invention further provides a display device, comprising any of the above touch panel provided by the embodiments of the present invention.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 7b is a schematic diagram showing distribution of capacitance values of respective self-capacitive electrodes in the touch panel shown in FIG. 7a;
FIG. 8b is a schematic diagram showing distribution of capacitance values of respective self-capacitive electrodes in the touch panel shown in FIG. 8a;
FIG. 9b is a schematic diagram showing distribution of capacitance values of respective self-capacitive electrodes in the touch panel shown in FIG. 9a;
FIG. 10b is a schematic diagram showing distribution of capacitance values of respective self-capacitive electrodes in the touch panel shown in FIG. 10a;
FIG. 11b is a schematic diagram showing distribution of capacitance values of respective self-capacitive electrodes in the touch panel shown in FIG. 11a;
FIG. 12b is a schematic diagram showing distribution of capacitance values of respective self-capacitive electrodes in the touch panel shown in FIG. 12a.

REFERENCE SIGNS

3—wiring terminal; 4—peripheral trace; 10—base substrate; 11—self-capacitive electrode; 12—touch chip; 13—wire; 111—self-capacitive electrode groups independent of each other; 112—independent self-capacitive electrode.

DESCRIPTION OF THE EMBODIMENTS

The specific modes for carrying out a touch panel, a touch positioning method thereof and a display device provided by the embodiments of the present invention are described in detail hereinafter in conjunction with the accompanying drawings.

The shapes and the thickness of respective film layers shown in the accompanying drawings are merely illustrative of embodiments of the present invention, but not intended to reflect real scales.

Figure 1:
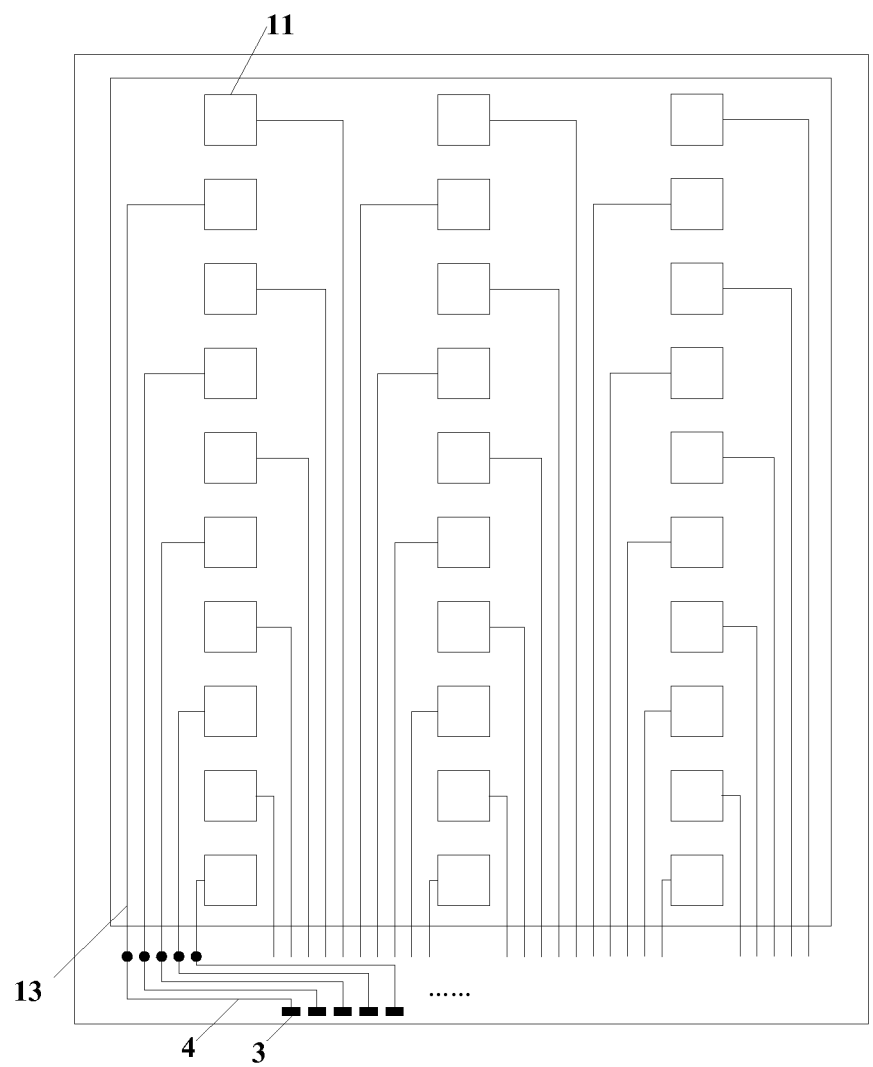
FIG. 1 is a top view of a self-capacitive touch panel.

In a touch panel designed to adopt the principle of self-capacitance, each of the self-capacitive electrodes needs to be connected with a wiring terminal (Pad) of a touch chip through a separate lead-out wire. As shown in FIG. 1, each lead-out wire may include: a wire 13 connecting a self-capacitive electrode 11 to a border of the touch panel, and a peripheral trace 4 arranged in the border for conducting the self-capacitive electrode 11 to a wiring terminal 3 of the touch chip. In implementation, since there are a great number of self-capacitive electrodes, there will also be many corresponding lead-out wires. Taking an example where each of the self-capacitive electrodes occupies an area of 5 mm*5 mm, a 5-inch liquid crystal display screen will need 264 self-capacitive electrodes; if each of the self-capacitive electrodes is designed smaller, there will be more self-capacitive electrodes, and more lead-out wires and more wiring terminals of the touch chip are needed. Therefore, how to reduce lead-out wires and wiring terminals of the touch chip without reducing self-capacitive electrodes has become a problem to be solved in a self-capacitive touch panel field.

Figure 2:
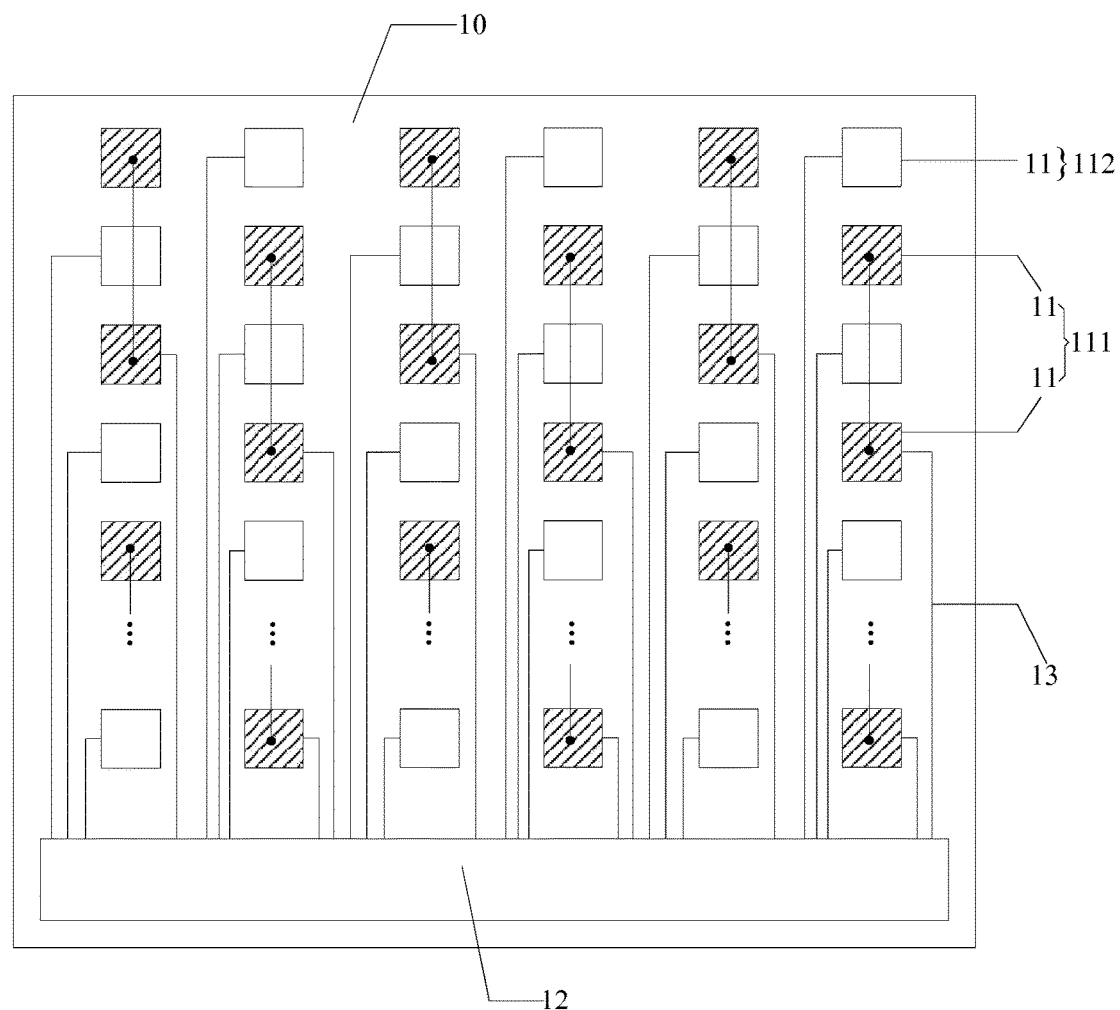
FIG. 2 is a top view of a touch panel provided by an embodiment of the present invention.

An embodiment of the present invention provides a touch panel, as shown in FIG. 2, comprising a base substrate 10, a plurality of self-capacitive electrodes 11 arranged in matrix on the base substrate 10, and a touch chip 12 for determining a touch position by detecting changes in capacitance values of the respective self-capacitive electrodes 11 during a touch period.

The plurality of self-capacitive electrodes are divided into several self-capacitive electrode groups 111 independent of each other and several independent self-capacitive electrodes 112; each of the independent self-capacitive electrodes 112 is one of the self-capacitive electrodes 11 respectively, and the respective independent self-capacitive electrodes 112 are electrically connected with the touch chip 12 through different wires 13; the respective self-capacitive electrode groups 111 include at least two self-capacitive electrodes 11 not adjacent to each other, and the respective self-capacitive electrodes 11 in a same self-capacitive electrode group 111 are electrically connected with the touch chip 12 through a same wire 13. With regard to respective self-capacitive electrodes 11 in the respective self-capacitive electrode groups 111, at least the self-capacitive electrodes 11 adjacent thereto on the upper, lower, left and right four sides are independent self-capacitive electrodes 112.

In the touch panel provided by the embodiment of the present invention, the plurality of self-capacitive electrodes are divided into several self-capacitive electrode groups independent of each other and several independent self-capacitive electrodes; each of the self-capacitive electrode groups includes at least two self-capacitive electrodes not adjacent to each other, and the respective self-capacitive electrodes in a same self-capacitive electrode group are electrically connected with the touch chip through a same wire, and with regard to the respective self-capacitive electrodes in the respective self-capacitive electrode groups, at least the self-capacitive electrodes located on the four adjacent positions thereto of upper, lower, left and right sides are independent self-capacitive electrodes. Therefore, as compared with that respective self-capacitive electrodes is usually electrically connected with a touch chip through respective wires, the wires for electrically connecting the self-capacitive electrodes with the touch chip can be reduced, and thus the lead-out wires in the touch panel and the wiring terminals of the touch chip are reduced.

It should be noted that, in the touch panel provided by the embodiment of the present invention, non-adjacent positions refer to positions not adjacent in any directions (not only in a row direction or a column direction, but also in a diagonal direction) with a space position inserted therebetween.

For example, in implementation, self-capacitive electrodes in a self-capacitive electrode group can be self-capacitive electrodes located on any non-adjacent positions, for example, not adjacent in a row direction, in a column direction, or in a diagonal direction, which is not limited here.

Figure 3A:
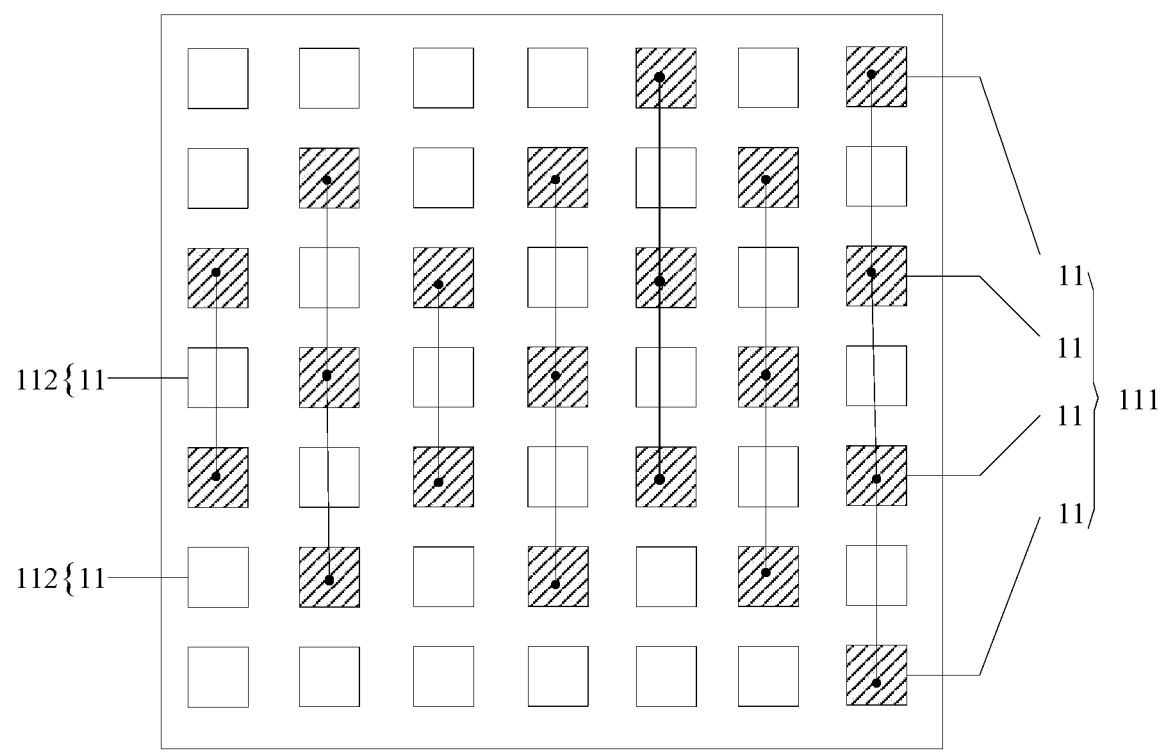
FIG. 3a to FIG. 3f are top views of touch panels provided by embodiments of the present invention, respectively.
Figure 3B:
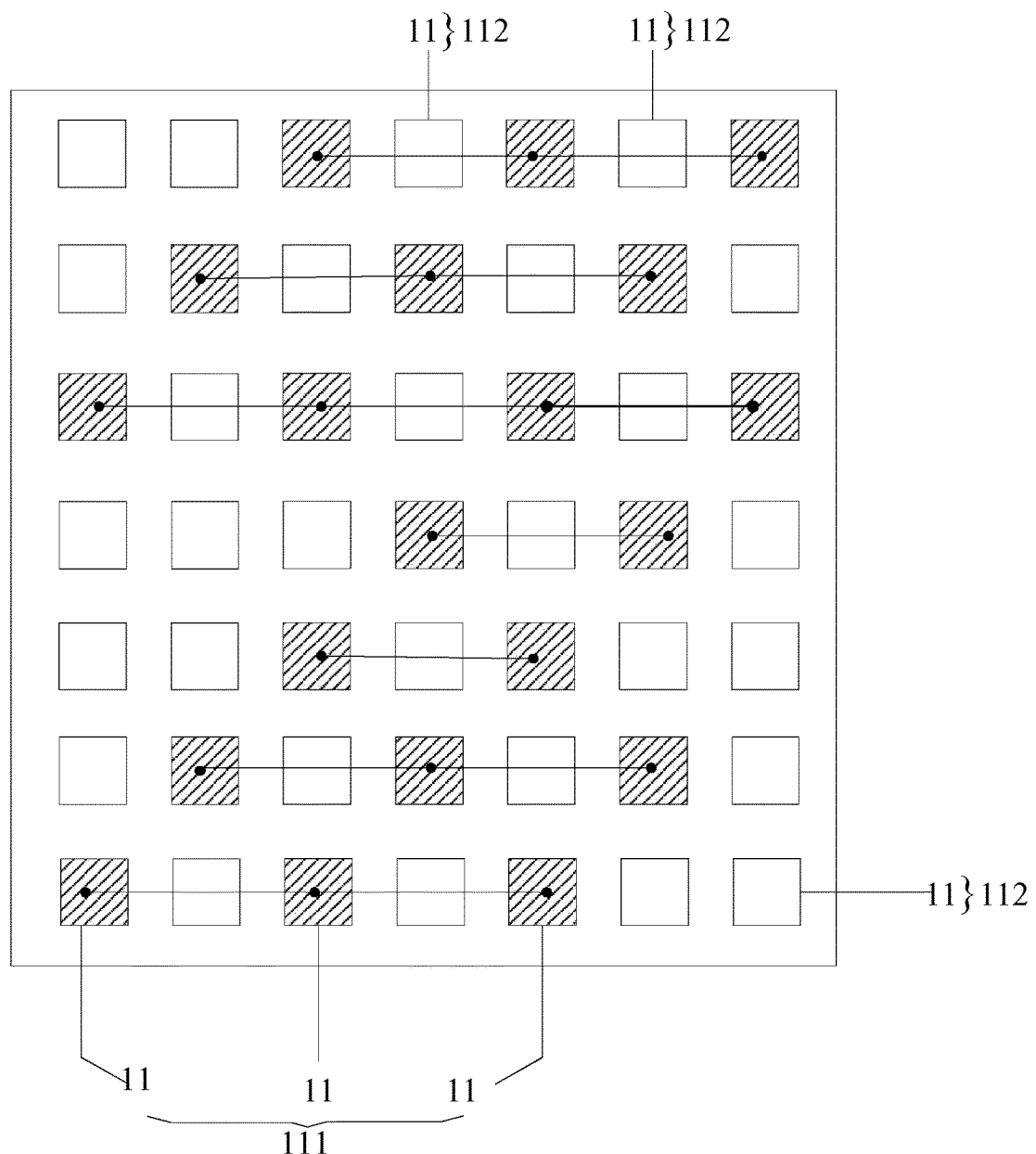
Figure 3C:
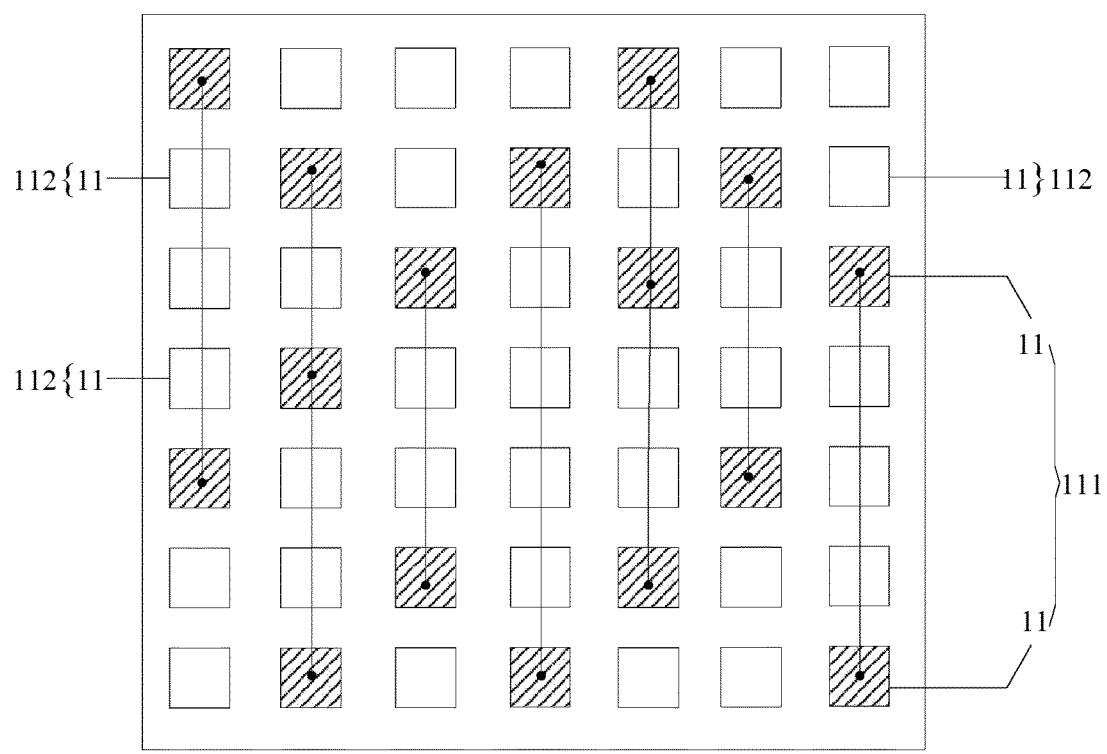

For example, as shown in FIG. 3a and FIG. 3c, the respective self-capacitive electrode groups 111 can include at least two self-capacitive electrodes 11 not adjacent to each other along a column direction; or, as shown in FIG. 3b, the respective self-capacitive electrode groups 111 can include at least two self-capacitive electrodes 1l not adjacent to each other along a row direction.

For example, the number of the self-capacitive electrodes in the respective self-capacitive electrode groups can be equal.

For example, as shown in FIG. 3a and FIG. 3b, the respective self-capacitive electrodes 11 in the same self-capacitive electrode group 111 can be separated from each other by one independent self-capacitive electrode 112. Of course, in implementation, as shown in FIG. 3c, the respective self-capacitive electrodes 11 in the same self-capacitive electrode group 111 can be separated from each other by two or more independent self-capacitive electrodes 112, which is not limited here.

For example, the number of the independent self-capacitive electrodes for separating the self-capacitive electrodes from each other in the respective self-capacitive electrode groups can be equal.

Figure 3D:
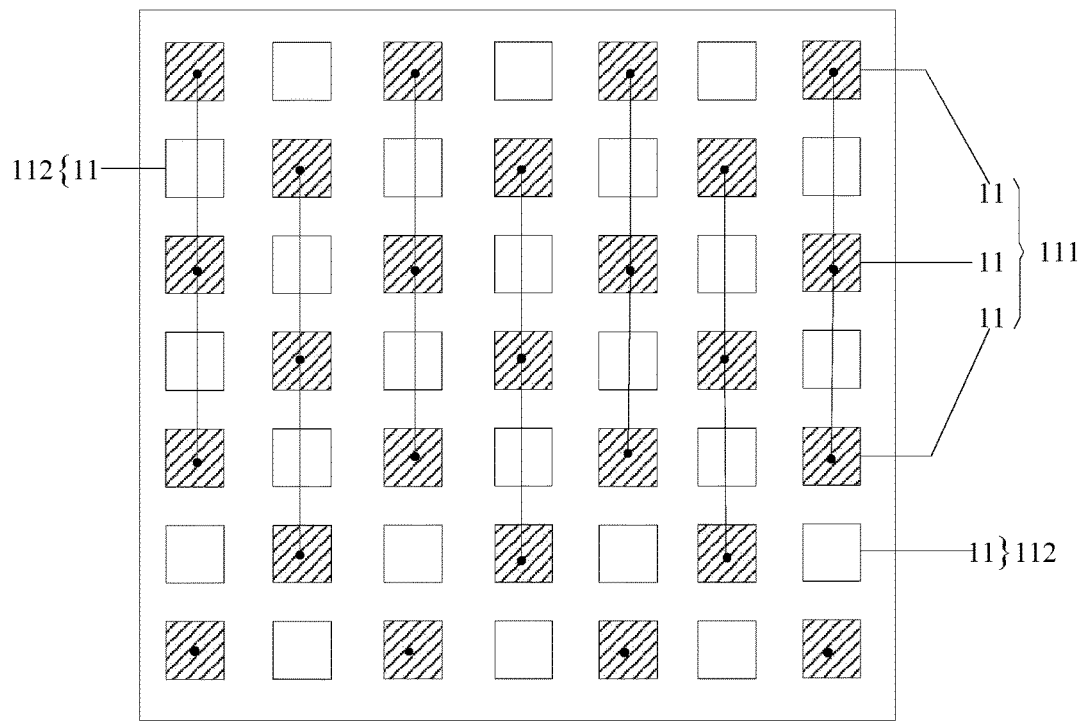

For example, as shown in FIG. 3d, the self-capacitive electrodes 11 located on the four adjacent positions of upper, lower, left and right sides of the respective independent self-capacitive electrodes 112 are the self-capacitive electrodes 11 in the self-capacitive electrode group 111.

Further, as shown in FIG. 3c, the respective self-capacitive electrode groups 111 can include two self-capacitive electrodes 11.

Figure 3E:
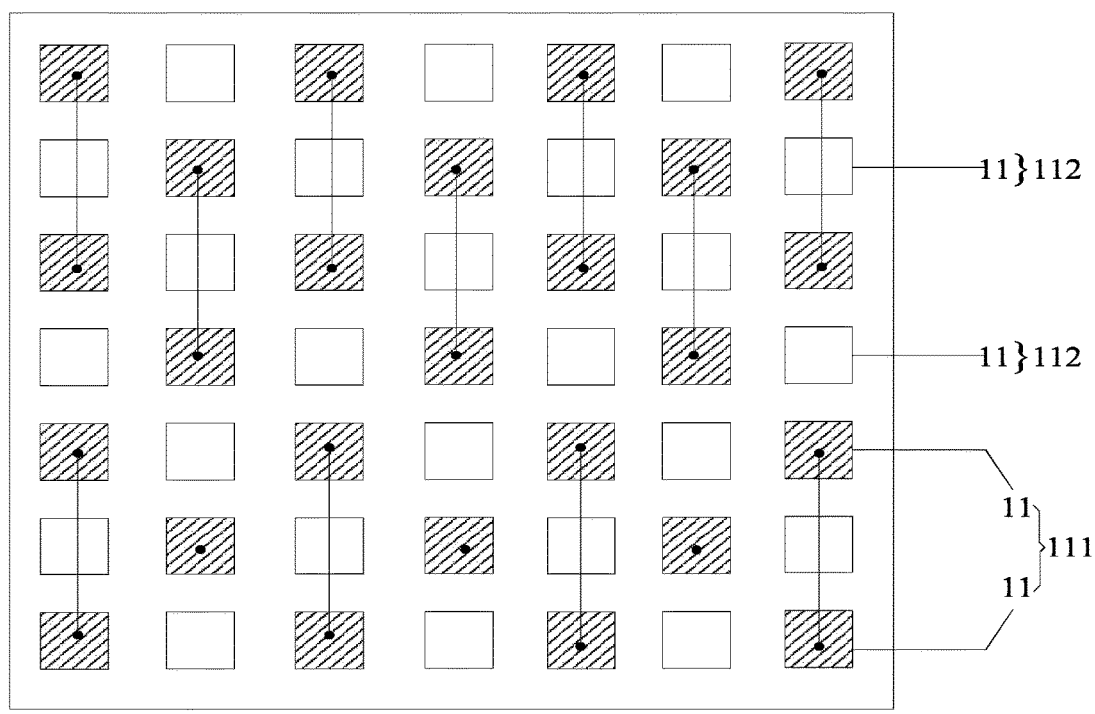
Figure 3F:
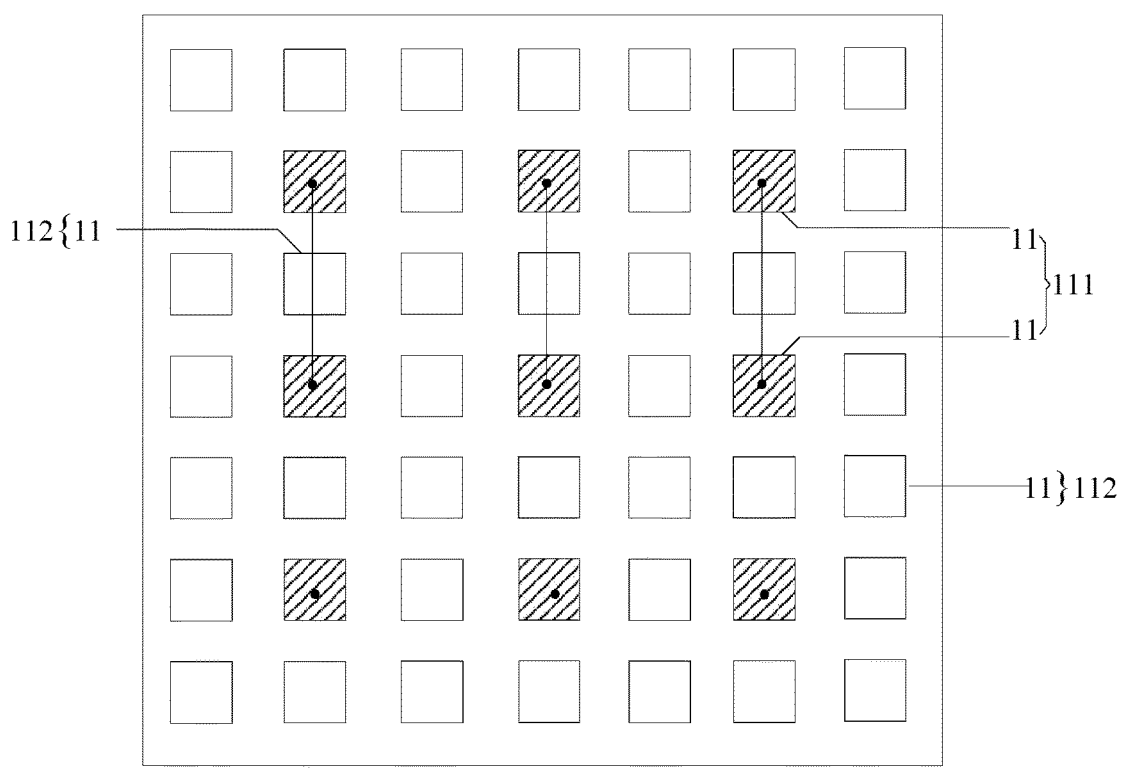

For example, as shown in FIG. 3f, the self-capacitive electrodes 11 located on adjacent positions of the respective self-capacitive electrodes 11 in the respective self-capacitive electrode groups 111 are independent self-capacitive electrodes 112.

Further, the self-capacitive electrodes and the wires for electrically connecting the touch chip with the self-capacitive electrodes can be arranged on the same layer or different layers, which is not limited here.

It should be noted that, the touch panel provided by the embodiment of the present invention can be applied to a touch screen (touch panel) only having a touch function, and can also be applied to a touch display screen (touch display panel) having both a touch function and a display function, which is not limited here.

Further, when the touch panel provided by the embodiment of the present invention is applied to a touch display screen, it can be of an add-on mode, or an in-cell mode, which is not limited here. In addition, the display screen may be a liquid crystal display screen or an organic light-emitting display screen, etc., which is not limited here.

For example, in the case that the touch panel provided by the embodiment of the present invention is applied to an in-cell touch display panel in which the display panel is a liquid crystal display panel, the respective self-capacitive electrodes are formed by segmenting a common electrode layer arranged on the base substrate; and the touch chip is further used for loading common electrode signals to respective self-capacitive electrodes during a display period.

In this way, a common electrode layer of the display panel is multiplexed as the self-capacitive electrodes of the touch panel provided by the embodiment of the present invention; a pattern of the common electrode layer of TN mode is changed to form a plurality of self-capacitive electrodes independent of each other and connect the self-capacitive electrodes to a wire of the touch chip. As compared with that two new film layers are needed to be added in a common array substrate when a touch function is realized by using the principle of mutual-capacitance, in the touch panel provided by the embodiment of the present invention without adding an additional film layer, patterns of corresponding self-capacitive electrodes and wires are formed by performing a patterning process on the original common electrode layer which is set as a whole layer, thus saving production cost, and improving production efficiency.

For example, since a common electrode layer of the display panel is multiplexed as the self-capacitive electrodes of the touch panel provided by the embodiment of the present invention, a time-division driving manner with touch and display periods should be adopted in implementation, and a display driving chip and a touch chip may be integrated into one chip, in order to further reduce the production cost.

Figure 4A:
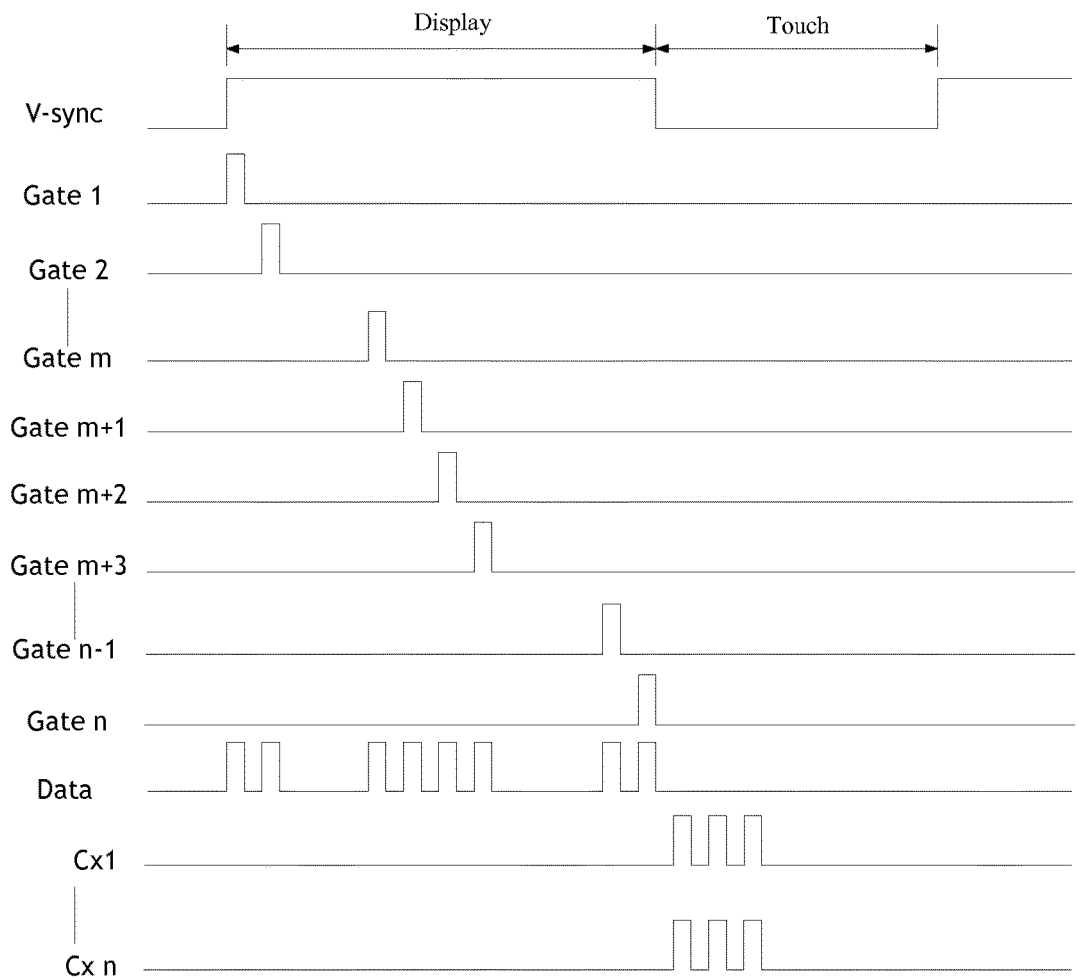
FIG. 4a and FIG. 4b are schematic diagrams of driving time sequence of the touch panel provided by the embodiment of the present invention, respectively.
Figure 4B:
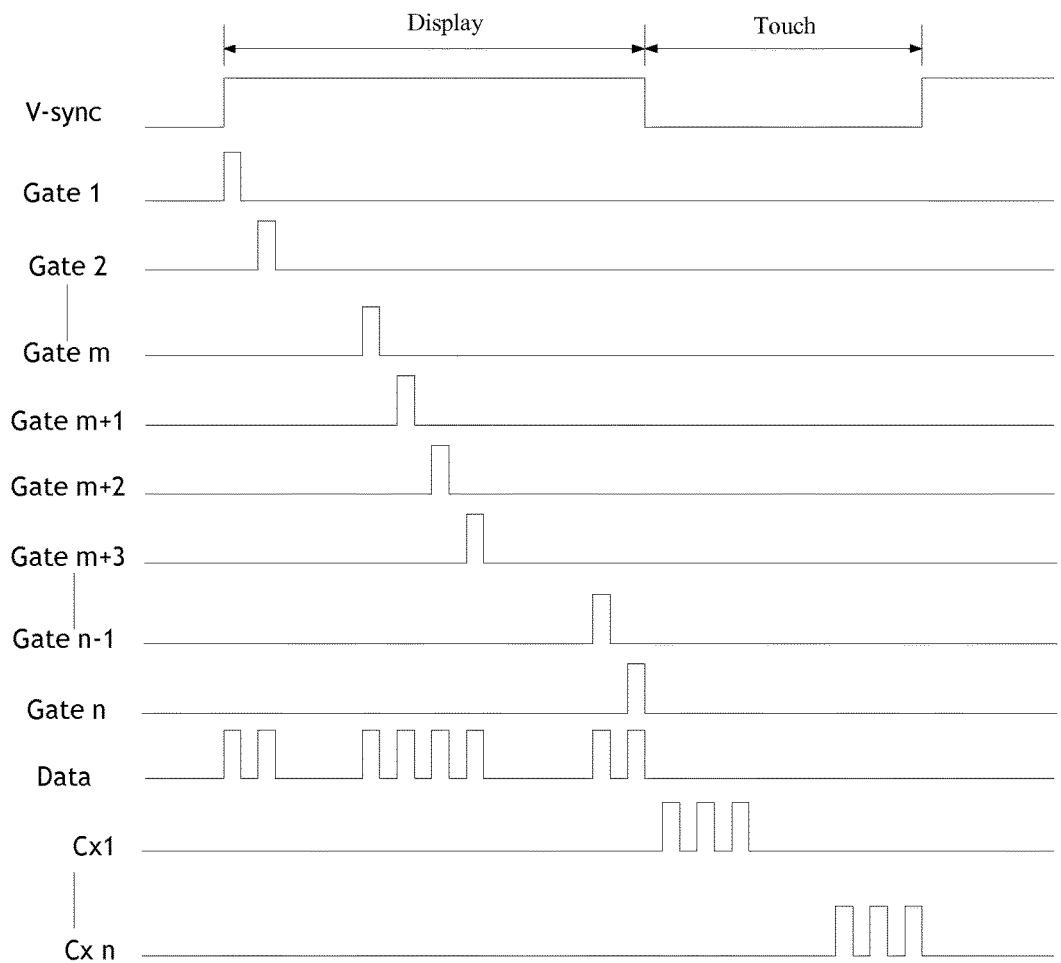

For example, in the driving time sequence diagram as shown in FIG. 4a and FIG. 4b, the period for the touch panel to display each frame (V-sync) is divided into a display scanning period (Display) and a touch scanning period (Touch). For example, in the driving time sequence diagram as shown in FIG. 4a and FIG. 4b, the period for the touch panel to display one frame is 16.7 milliseconds (ms), wherein 4 ms is selected as the touch scanning period, and the other 12.7 ms is selected as the display scanning period. Of course, it is possible to appropriately adjust the duration of the touch scanning period and the display scanning period according to the processing capacity of IC chips, which is not particularly limited here. During the display scanning period (Display), gate scanning signals are applied to gate signal lines Gate 1, Gate 2, . . . Gate n in the touch panel successively, a gray scale signal is applied to data signal line Data, and common electrode signals are applied to respective self-capacitive electrodes Cx1 . . . Cx n by the touch chip connected with the respective self-capacitive electrodes Cx1 . . . Cx n, so as to implement a liquid crystal display function. During the touch period (Touch), as shown in FIG. 4a, the touch chip connected with the respective self-capacitive electrodes Cx1 . . . Cx n applies driving signals to the respective self-capacitive electrodes Cx1 . . . Cx n at the same time, and receives feedback signals of the respective self-capacitive electrodes Cx1 . . . Cx n at the same time; further as shown in FIG. 4b, the touch chip connected with the respective self-capacitive electrodes Cx1 . . . Cx n applies driving signals to the respective self-capacitive electrodes Cx1 . . . Cx n sequentially, and receives feedback signals of the respective self-capacitive electrodes Cx1 . . . Cx n respectively, which is not limited here. Whether a touch occurs is judged by analyzing the feedback signals, so as to implement a touch function.

Further, in the touch panel provided by the embodiment of the present invention, since capacitance of human body acts on self-capacitances of respective self-capacitive electrodes in a manner of directly coupling, when the human body touches the panel, only capacitance value of a self-capacitive electrode under the touch position has great change, while capacitance values of self-capacitive electrodes adjacent to the self-capacitive electrode under the touch position has slight change. In this way, when sliding on the touch panel, touch coordinates of a region where the self-capacitive electrode is located cannot be determined. In order to solve the problem, in an in-cell touch panel provided by the embodiment of the present invention, side edges of two adjacent self-capacitive electrodes opposite to each other are set to be fold lines, so as to increase changes in capacitance values of self-capacitive electrodes adjacent to the self-capacitive electrode under the touch position.

Figure 5A:
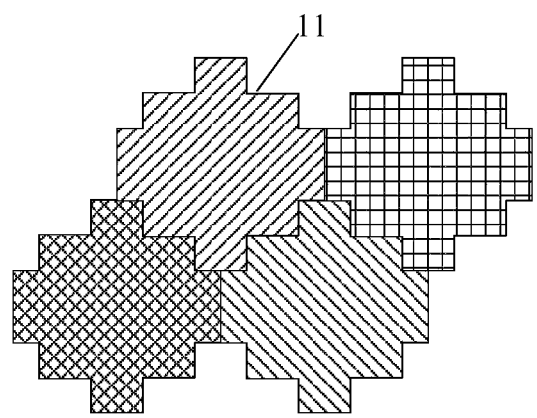
FIG. 5a and FIG. 5b are structural schematic diagrams respectively showing opposite side edges of two adjacent self-capacitive electrodes being fold lines in the touch panel provided by the embodiment of the present invention.

In implementation, overall shapes of respective self-capacitive electrodes can be set in one of the two manners or in combination of the two manners as follows:

1. The opposite side edges of two adjacent self-capacitive electrodes which are fold lines are set to have step-like structures, and the two step-like structures are consistent in shape and match each other, as shown in FIG. 5a; and 2*2 self-capacitive electrodes 11 are shown in FIG. 5a.

Figure 5B:
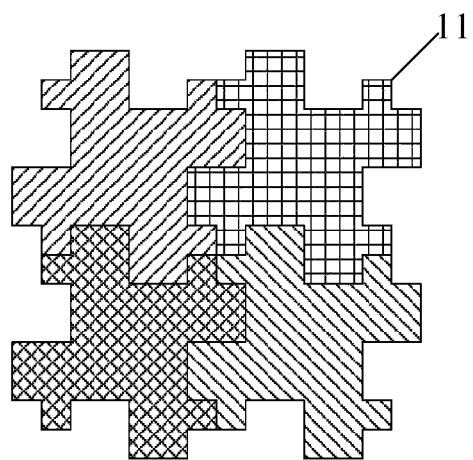

2. The opposite side edges of two adjacent self-capacitive electrodes which are fold lines are set to have concave-convex structures, and the two concave-convex structures are consistent in shape and match each other, as shown in FIG. 5b; and 2*2 self-capacitive electrodes 11 are shown in FIG. 5b.

Further, because there are several self-capacitive electrode groups consisting of at least two self-capacitive electrodes, when part of the self-capacitive electrodes in the self-capacitive electrode group in the touch panel are touched and the other part are not touched, since the respective self-capacitive electrodes in the same self-capacitive electrode group are electrically connected with each other, the untouched self-capacitive electrodes in the same self-capacitive electrode group will have occurred capacitance too. To accurately determine a touch position, it is necessary to at first exclude such positions which are actually untouched but have a same change in capacitance as the touched self-capacitive electrode, so the positions of self-capacitive electrodes which are actually touched can be determined.

In the touch panel provided by the embodiment of the present invention, if, with regard to each of the self-capacitive electrodes in the self-capacitive electrode groups, the four adjacent self-capacitive electrodes located on the upper, lower, left and right sides thereof are independent self-capacitive electrodes, it can be determined whether a touch actually occurs on the self-capacitive electrode in the self-capacitive electrode group according to changes in capacitance values of the self-capacitive electrodes located on the four adjacent positions, i.e., it is determined whether the position of the self-capacitive electrode is a ghost point position.

Figure 6:
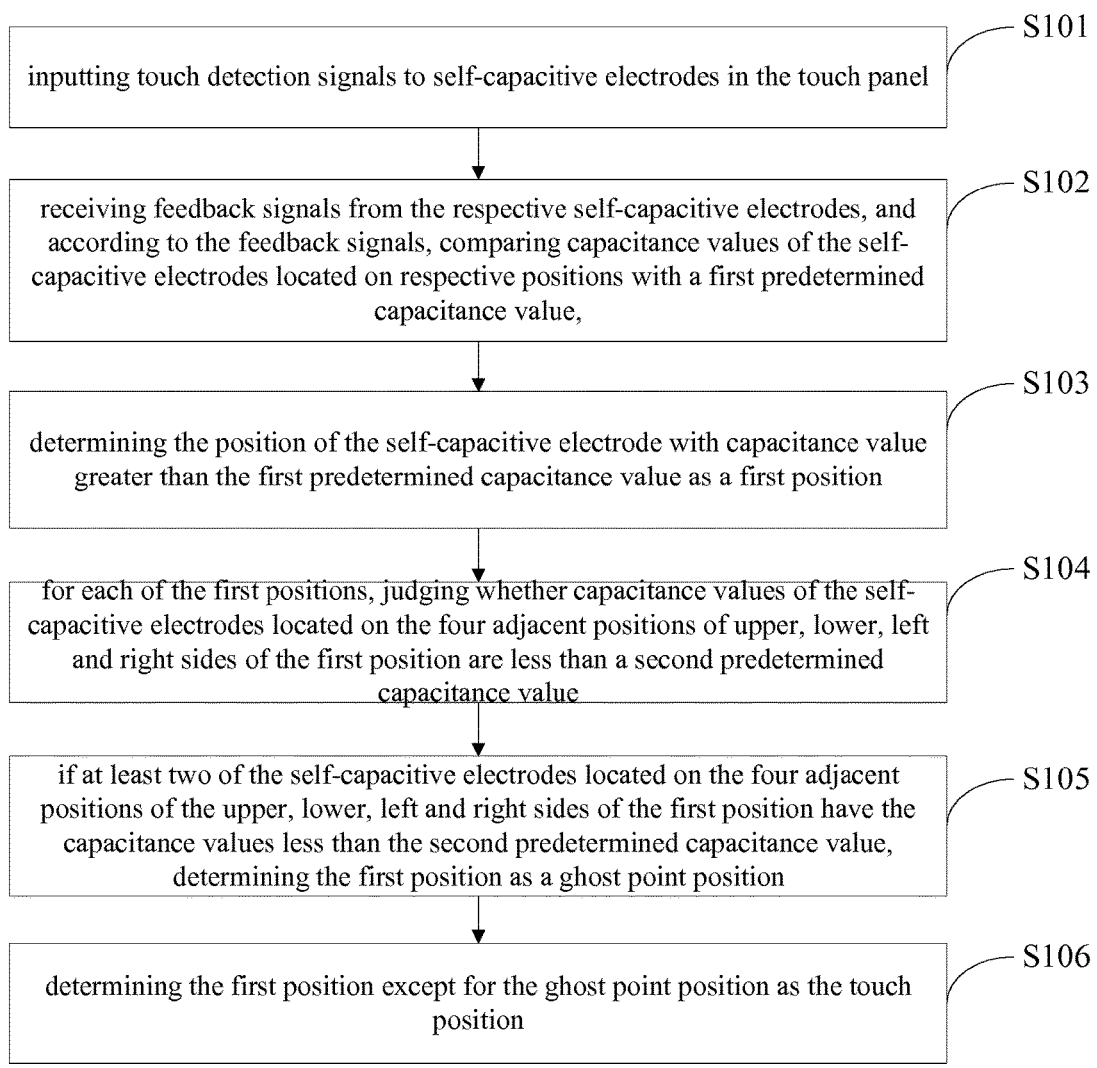
FIG. 6 is a flowchart of a touch positioning method of a touch panel provided by an embodiment of the present invention.

Therefore, an embodiment of the present invention further provides a touch positioning method for the above touch panel, as shown in FIG. 6, comprising steps of:

S101: inputting touch detection signals to self-capacitive electrodes in the touch panel;

S102: receiving feedback signals from the respective self-capacitive electrodes, and according to the feedback signals, comparing capacitance values of the self-capacitive electrodes located on respective positions with a first predetermined capacitance value;

S103: determining a position of a self-capacitive electrode whose capacitance value is greater than the first predetermined capacitance value as a first position;

S104: for each of the first positions, judging whether capacitance values of the self-capacitive electrodes located on the four adjacent positions of upper, lower, left and right sides of the first position are less than a second predetermined capacitance value;

S105: if at least two of the four self-capacitive electrodes located on the four adjacent positions of the upper, lower, left and right sides of the first position have the capacitance values less than the second predetermined capacitance value, determining the first position as a ghost point position;

S106: determining the first position except for the ghost point position as a touch position.

In the touch positioning method of the touch panel provided by the embodiment of the present invention, firstly, a position of a self-capacitive electrode whose capacitance value is greater than the first predetermined capacitance value is determined as a first position; secondly, a ghost point position is found out from the first position according to changes in capacitance values of the self-capacitive electrodes located on the four adjacent positions of the upper, lower, left and right sides of the self-capacitive electrode located on the first position; finally, the first position except for the ghost point position is determined as a touch position, so as to implement accurate touch of the touch panel.

For example, in implementation, in the touch positioning method provided by the embodiment of the present invention, the first predetermined capacitance value is generally determined as a minimum capacitance value when touch occurs, which can be obtained according to experience, and will be not described in detail here.

For example, in implementation, in the touch positioning method provided by the embodiment of the present invention, the second predetermined capacitance value is generally determined as a minimum capacitance value resulted from influence of the touch on the self-capacitive electrode on the nearest position, which can be obtained according to experience, and will be not described in detail here.

Taking a touch panel with a structure shown in FIG. 3e for example, the touch positioning method provided by the embodiment of the present invention is illustrated by specific embodiments hereinafter.

Embodiment I

For example, as shown in FIG. 7a, FIG. 8a, FIG. 9a, FIG. 10a, FIG. 11a and FIG. 12a, 5*5 self-capacitive electrodes 11 are taken. In the drawings, X represents the number of rows (X=1, 2 . . . 5), and Y represents the number of columns (Y=1, 2 . . . 5), positions of the respective self-capacitive electrodes 11 are represented as (x, y). It is assumed when the touch panel is not touched, capacitance values of self-capacitive electrodes located on respective positions are 0, and capacitance carried by a finger is 500; when one finger touches one position, the capacitance value of the self-capacitive electrode located on the position is changed to 500; when one finger touches two position, the capacitance values of the self-capacitive electrodes located on the two positions are changed to 250 respectively; when two fingers touch one position at the same time, the capacitance value of the self-capacitive electrode located on the position is changed to 1000. And when a finger touches a certain position, capacitances of self-capacitive electrodes located around the position are inevitably changes, and the nearer a position of a self-capacitive electrode to the position, the greater the change in capacitance is; it is assumed that capacitance of the nearest self-capacitive electrode is 50, and the self-capacitive electrodes located a little far from the position are also affected, but the influence is relatively small and negligible here; it is assumed that the first predetermined capacitance value is 220, and the second predetermined capacitance value is 25.

I. A First Case of One Touch Point on the Touch Panel

Figure 7A:
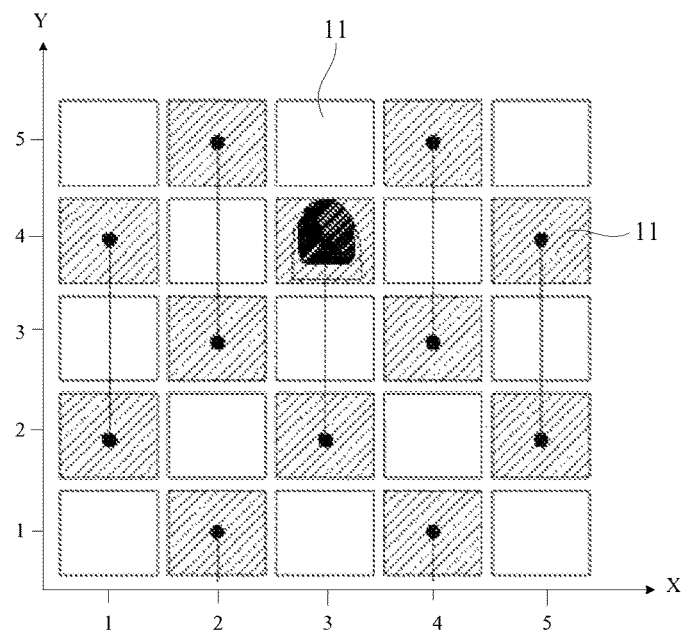
FIG. 7a is a touch schematic diagram I of a touch panel provided by an embodiment of the present invention.
Figure 7B:
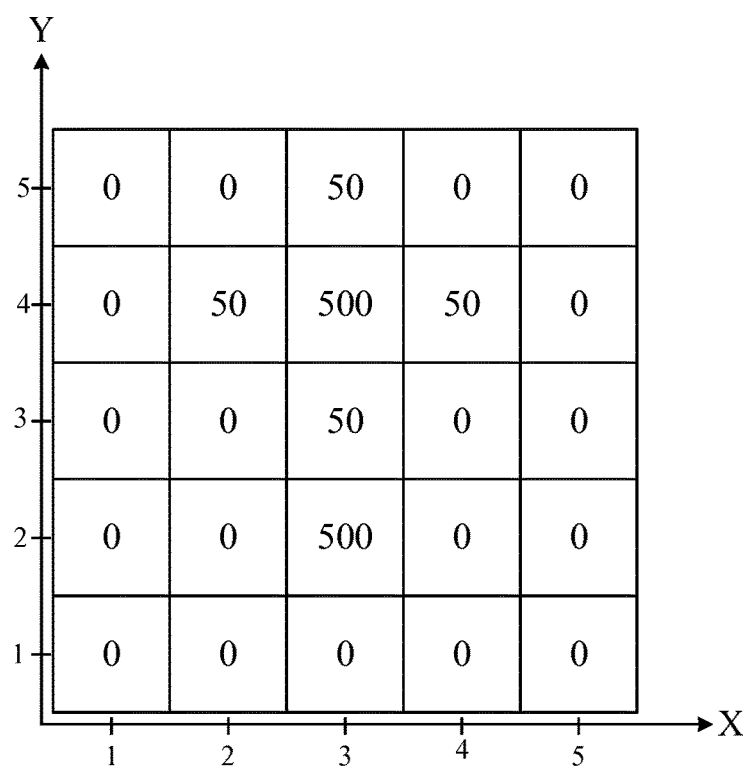

When the position of one of the self-capacitive electrodes of the self-capacitive electrode group, e.g., position (3, 4) as shown in FIG. 7a, is touched, according to the above assumption, capacitances of the self-capacitive electrodes 11 located on the respective positions in FIG. 7a are shown in FIG. 7b.

1. The capacitance values of the self-capacitive electrodes 11 located on the respective positions in FIG. 7b are compared with 220 (the first predetermined capacitance value); since the capacitance values of the self-capacitive electrodes 11 located on positions (3, 2) and (3, 4) are greater than 220, the positions (3, 2) and (3, 4) are determined as first positions.

2. For each of the first positions:

According to the capacitance values of the self-capacitive electrodes 11 located on the four adjacent positions of the upper, lower, left and right sides of the position (3, 2), it can be determined that there are three positions on which the self-capacitive electrodes 11 have the capacitance value smaller than 25 (the second predetermined capacitance value), among the four adjacent positions of the upper, lower, left and right sides of the position (3, 2), so the position (3, 2) is a ghost point position.

According to the capacitance values of the self-capacitive electrodes 11 located on the four adjacent positions of the upper, lower, left and right sides of the position (3, 4), it can be determined that the capacitance values of the self-capacitive electrodes 11 located on all the four adjacent positions of the upper, lower, left and right sides of the position (3, 4) are greater than 25 (the second predetermined capacitance value), so the position (3, 4) is not a ghost point position.

Therefore, only the position (3, 2) of the first positions is the ghost point position.

3. The ghost point position (3, 2) is removed from the first positions (3, 2) and (3, 4), so the remaining position (3, 4) is the touch position.

II. A Second Case of One Touch Point on the Touch Panel.

Figure 8A:
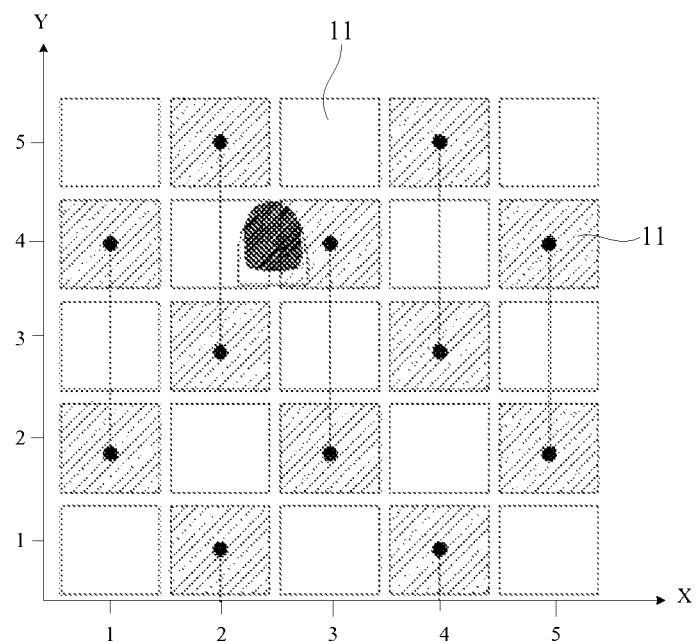
FIG. 8a is a touch schematic diagram II of a touch panel provided by an embodiment of the present invention.
Figure 8B:
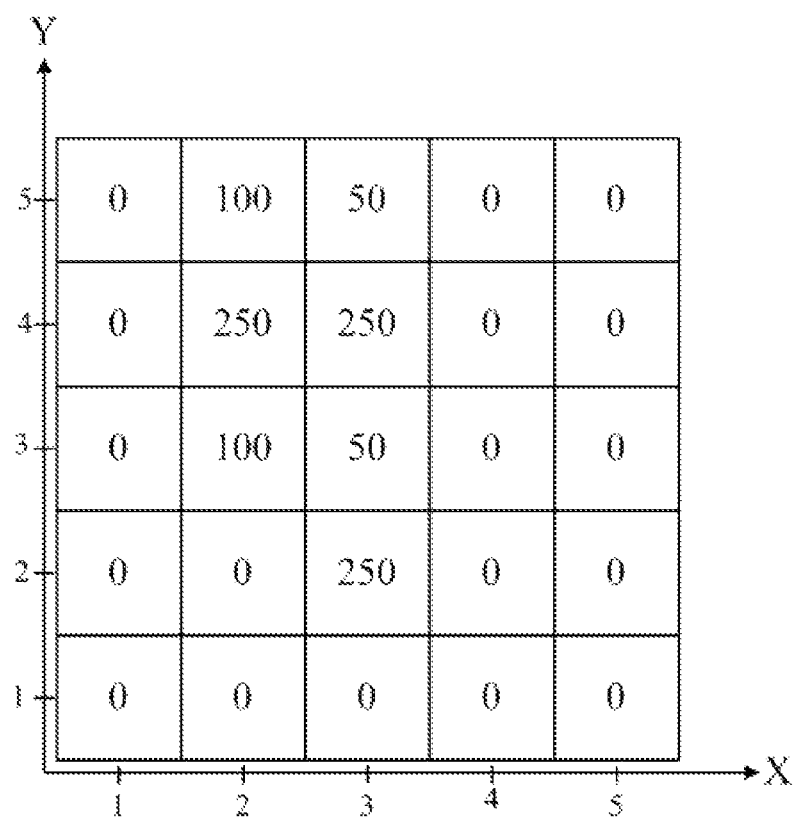

When the position of one of the self-capacitive electrodes of the self-capacitive electrode group and the position of the independent self-capacitive electrodes adjacent thereto, e.g., positions (2, 4) and (3, 4) as shown in FIG. 8a, are touched, according to the above assumption, capacitances of the self-capacitive electrodes 11 located on the respective positions in FIG. 8a are shown in FIG. 8b.

1. The capacitance values of the self-capacitive electrodes 11 located on the respective positions in FIG. 8b are compared with 220 (the first predetermined capacitance value); since the capacitance values of the self-capacitive electrodes 11 located on positions (2, 4), (3, 2) and (3, 4) are greater than 220, the positions (2, 4), (3, 2) and (3, 4) are determined as first positions.

2. For each of the first positions:

According to the capacitance values of the self-capacitive electrodes 11 located on the four adjacent positions of the upper, lower, left and right sides of the position (2, 4), it can be determined that there is only one position on which the self-capacitive electrode 11 has a capacitance value smaller than 25 (the second predetermined capacitance value), among the four adjacent positions of the upper, lower, left and right sides of the position (2, 4), so the position (2, 4) is not a ghost point position.

According to the capacitance values of the self-capacitive electrodes 11 located on the four adjacent positions of the upper, lower, left and right sides of the position (3, 2), it can be determined that there are three positions on which the self-capacitive electrodes 11 have the capacitance value smaller than 25 (the second predetermined capacitance value), among the four adjacent positions of the upper, lower, left and right sides of the position (3, 2), so the position (3, 2) is a ghost point position.

According to the capacitance values of the self-capacitive electrodes 11 located on the four adjacent positions of the upper, lower, left and right sides of the position (3, 4), it can be determined that there is only one position on which the self-capacitive electrode 11 has the capacitance value smaller than 25 (the second predetermined capacitance value), among the four adjacent positions of the upper, lower, left and right sides of the position (3, 4), so the position (3, 4) is not a ghost point position.

Therefore, only the position (3, 2) of the first positions is the ghost point position.

3. The ghost point position (3, 2) is removed from the first positions (2, 4) (3, 2) and (3, 4), so the remaining positions (2, 4) and (3, 4) are the touch positions.

III. A First Case of Two Touch Points on the Touch Panel.

Figure 9A:
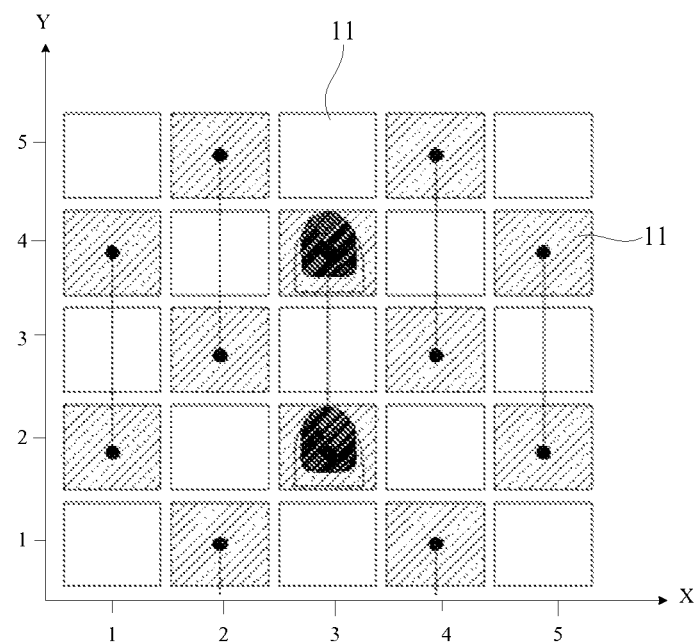
FIG. 9a is a touch schematic diagram III of a touch panel provided by an embodiment of the present invention.
Figure 9B:
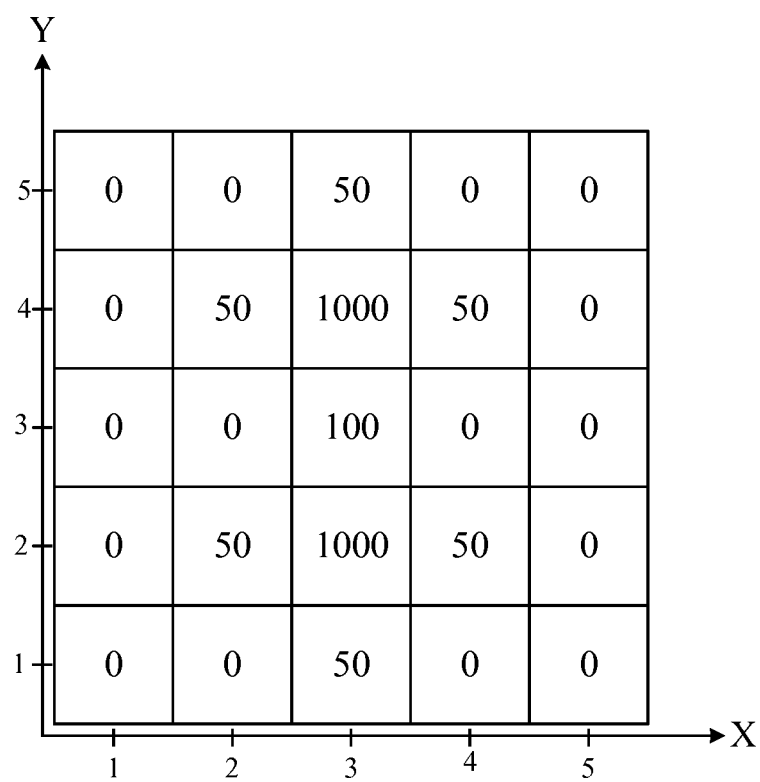

When the positions of two self-capacitive electrodes in a self-capacitive electrode group are touched, e.g., positions (3, 2) and (3, 4) as shown in FIG. 9a, according to the above assumption, capacitances of the self-capacitive electrodes 11 located on the respective positions in FIG. 9a are shown in FIG. 9b.

1. The capacitance values of the self-capacitive electrodes 11 located on the respective positions in FIG. 9b are compared with 220 (the first predetermined capacitance value); since the capacitance values of the self-capacitive electrodes 11 located on positions (3, 2) and (3, 4) are greater than 220, the positions (3, 2) and (3, 4) are determined as first positions.

2. For each of the first positions:

According to the capacitance values of the self-capacitive electrodes 11 located on the four adjacent positions of the upper, lower, left and right sides of the position (3, 2), it can be determined that the capacitance values of the self-capacitive electrodes 11 located on all the four adjacent positions of the upper, lower, left and right sides of the position (3, 2) are greater than 25 (the second predetermined capacitance value), so the position (3, 2) is not a ghost point position.

According to the capacitance values of the self-capacitive electrodes 11 located on the four adjacent positions of the upper, lower, left and right sides of the position (3, 4), it can be determined that the capacitance values of the self-capacitive electrodes 11 located on all the four adjacent positions of the upper, lower, left and right sides of the position (3, 4) are greater than 25 (the second predetermined capacitance value), so the position (3, 4) is not a ghost point position.

Therefore, none of the first positions is the ghost point position.

3. So the first positions (3, 2) and (3, 4) are the touch positions.

IV. A Second Case of Two Touch Points on the Touch Panel.

Figure 10A:
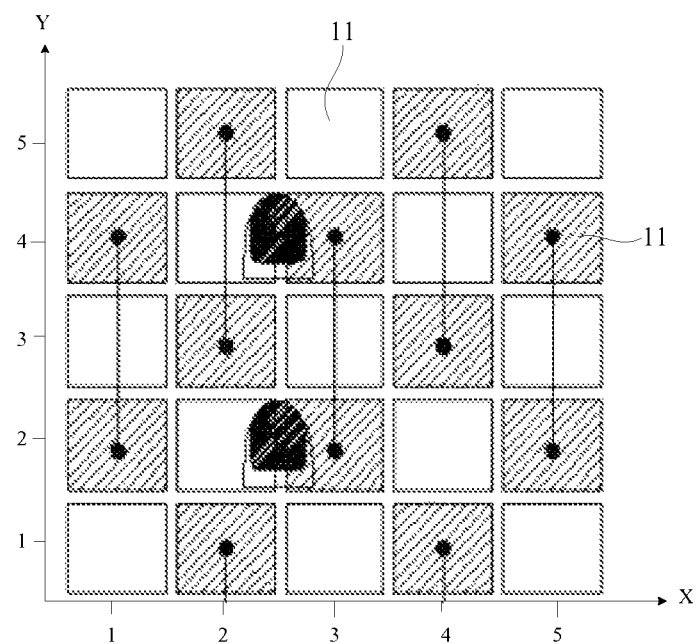
FIG. 10a is a touch schematic diagram IV of a touch panel provided by an embodiment of the present invention.
Figure 10B:
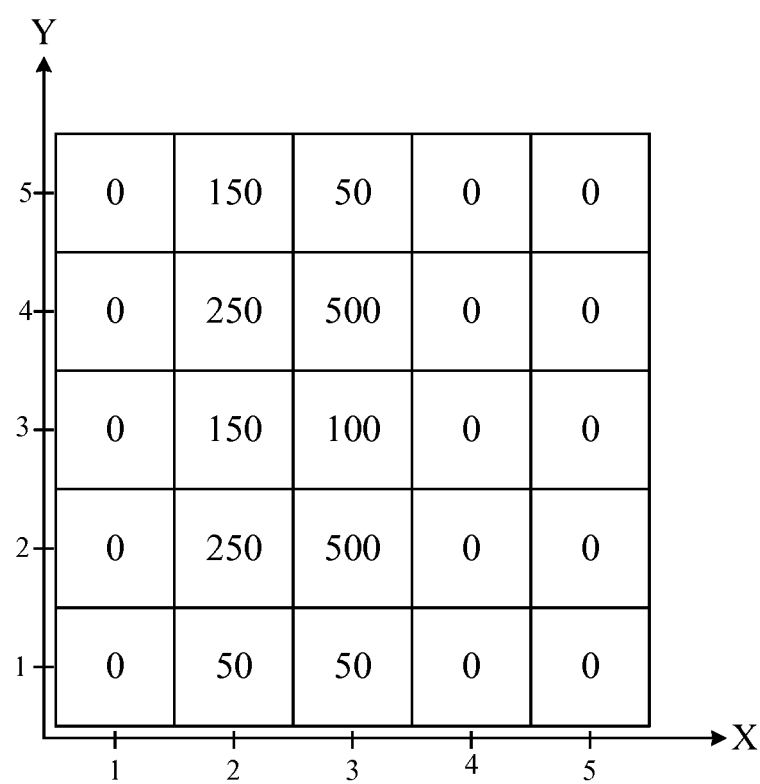

When the positions of two self-capacitive electrodes in a self-capacitive electrode group and the positions of the independent self-capacitive electrodes adjacent thereto, e.g., positions (2, 2) and (3, 2), (2, 4) and (3, 4) as shown in FIG. 10a, are touched, according to the above assumption, capacitances of the self-capacitive electrodes 11 located on the respective positions in FIG. 10a are shown in FIG. 10b.

1. The capacitance values of the self-capacitive electrodes 11 located on the respective positions in FIG. 10b are compared with 220 (the first predetermined capacitance value); since the capacitance values of self-capacitive electrodes 11 located on positions (2, 2), (2, 4), (3, 2) and (3, 4) are greater than 220, the positions (2, 2), (2, 4), (3, 2) and (3, 4) are determined as first positions.

2. For each of the first positions:

According to the capacitance values of the self-capacitive electrodes 11 located on the four adjacent positions of the upper, lower, left and right sides of the position (2, 2), it can be determined that there is only one position on which the self-capacitive electrode 11 has the capacitance value smaller than 25 (the second predetermined capacitance value), among the four adjacent positions of the upper, lower, left and right sides of the position (2, 2), so the position (2, 2) is not a ghost point position.

According to the capacitance values of the self-capacitive electrodes 11 located on the four adjacent positions of the upper, lower, left and right sides of the position (2, 4), it can be determined that there is only one position on which the self-capacitive electrode 11 has the capacitance value smaller than 25 (the second predetermined capacitance value), among the four adjacent positions of the upper, lower, left and right sides of the position (2, 4), so the position (2, 4) is not a ghost point position.

According to the capacitance values of the self-capacitive electrodes 11 located on the four adjacent positions of the upper, lower, left and right sides of the position (3, 2), it can be determined that there is only one position on which the self-capacitive electrode 11 has the capacitance value smaller than 25 (the second predetermined capacitance value), among the four adjacent positions of the upper, lower, left and right sides of the position (3, 2), so the position (3, 2) is not a ghost point position.

According to the capacitance values of the self-capacitive electrodes 11 located on the four adjacent positions of the upper, lower, left and right sides of the position (3, 4), it can be determined that there is only one position on which the self-capacitive electrode 11 has the capacitance value smaller than 25 (the second predetermined capacitance value), among the four adjacent positions of the upper, lower, left and right sides of the position (3, 4), so the position (3, 4) is not a ghost point position.

Therefore, none of the first positions is the ghost point position.

3. So the first positions (2, 2), (2, 4) (3, 2) and (3, 4) are the touch positions.

V. A Third Case of Two Touch Points on the Touch Panel.

Figure 11A:
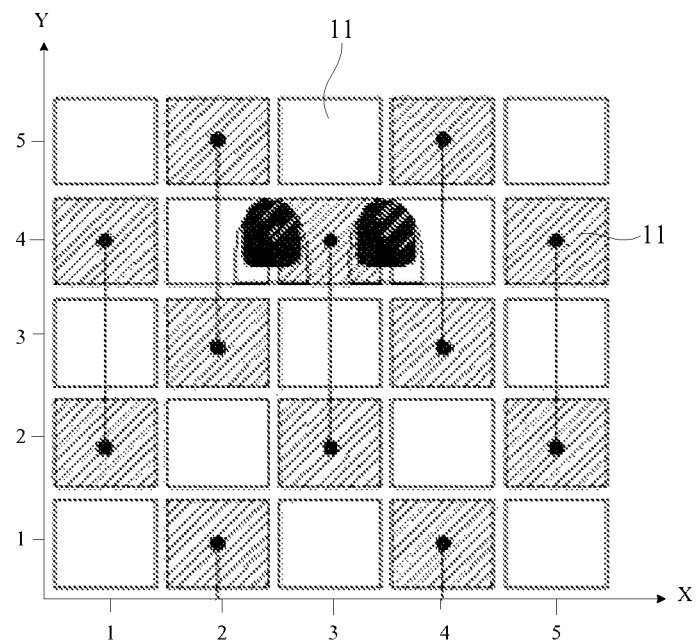
FIG. 11a is a touch schematic diagram V of a touch panel provided by an embodiment of the present invention.
Figure 11B:
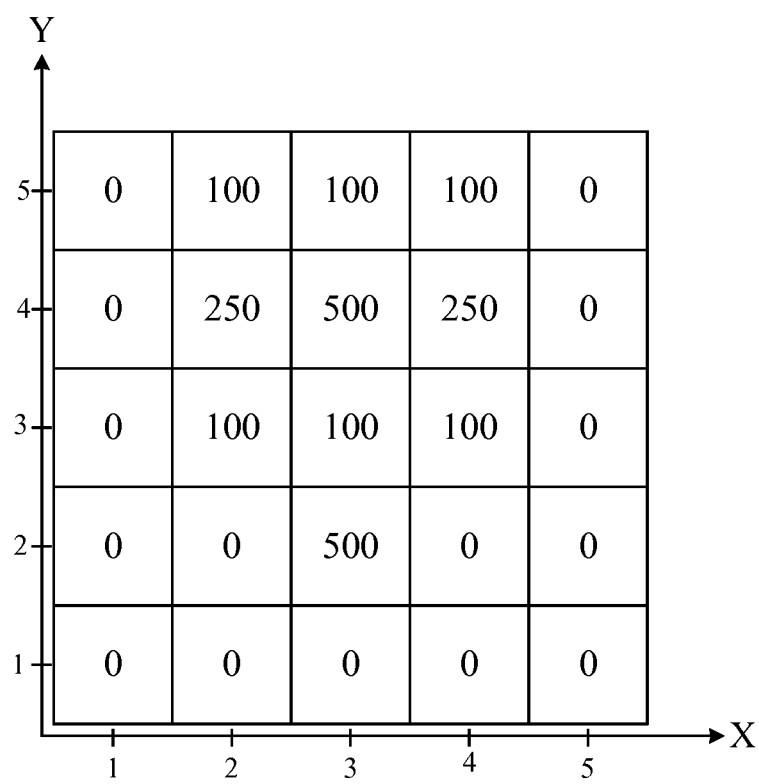

When the position of one of the self-capacitive electrodes in the self-capacitive electrode group and positions of two independent self-capacitive electrodes adjacent thereto, e.g., positions (2, 4), (3, 4) and (4, 4) as shown in FIG. 11a, are touched, according to the above assumption, capacitances of the self-capacitive electrodes 11 located on the respective positions in FIG. 11a are shown in FIG. 11b.

1. The capacitance values of the self-capacitive electrodes 11 located on the respective positions in FIG. 11b are compared with 220 (the first predetermined capacitance value); since the capacitance values of self-capacitive electrodes 11 located on positions (2, 4), (3, 2), (3, 4) and (4, 4) are greater than 220, the positions (2, 4), (3, 2), (3, 4) and (4, 4) are determined as first positions.

2. For each of the first positions:

According to the capacitance values of the self-capacitive electrodes 11 located on the four adjacent positions of the upper, lower, left and right sides of the position (2, 4), it can be determined there is only one position on which the self-capacitive electrode 11 has the capacitance value smaller than 25 (the second predetermined capacitance value), among the four adjacent positions of the upper, lower, left and right sides of the position (2, 4), so the position (2, 4) is not a ghost point position.

According to the capacitance values of the self-capacitive electrodes 11 located on the four adjacent positions of the upper, lower, left and right sides of the position (3, 2), it can be determined that there are three positions on which the self-capacitive electrodes 11 have the capacitance value smaller than 25 (the second predetermined capacitance value), among the four adjacent positions of the upper, lower, left and right sides of the position (3, 2), so the position (3, 2) is a ghost point position.

According to the capacitance values of the self-capacitive electrodes 11 located on the four adjacent positions of the upper, lower, left and right sides of the position (3, 4), it can be determined that the capacitance values of the self-capacitive electrodes 11 located on all the four adjacent positions of the upper, lower, left and right sides of the position (3, 4) are greater than 25 (the second predetermined capacitance value), so the position (3, 4) is not a ghost point position.

According to the capacitance values of the self-capacitive electrodes 11 located on the four adjacent positions of the upper, lower, left and right sides of the position (4, 4), it can be determined that there is only one position on which the self-capacitive electrode 11 has the capacitance value smaller than 25 (the second predetermined capacitance value), among the four adjacent positions of the upper, lower, left and right sides of the position (4, 4), so the position (4, 4) is not a ghost point position.

Therefore, only the position (3, 2) of the first positions is the ghost point position.

3. The ghost point position (3, 2) is removed from the first positions (2, 4), (3, 2), (3, 4) and (4, 4), so the remaining positions (2, 4), (3, 4) and (4, 4) are touch positions.

VI. A Case of Three Touch Points on the Touch Panel.

Figure 12A:
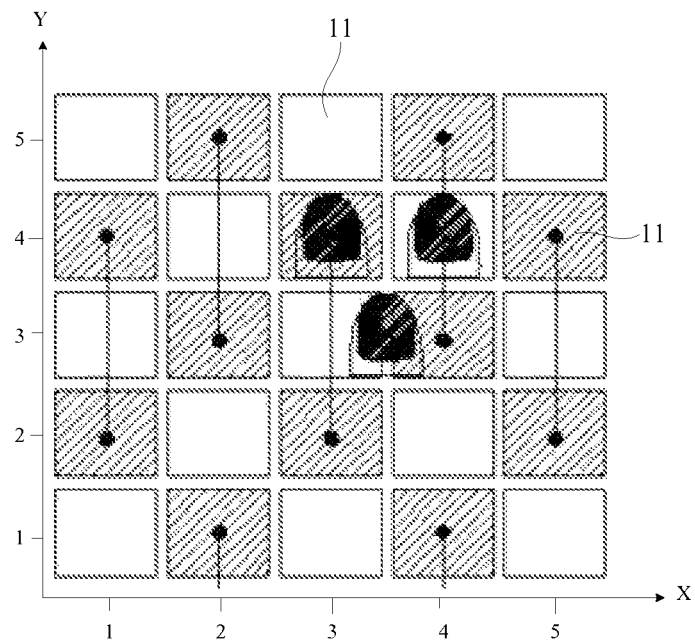
FIG. 12a is a touch schematic diagram V1 of a touch panel provided by an embodiment of the present invention.
Figure 12B:
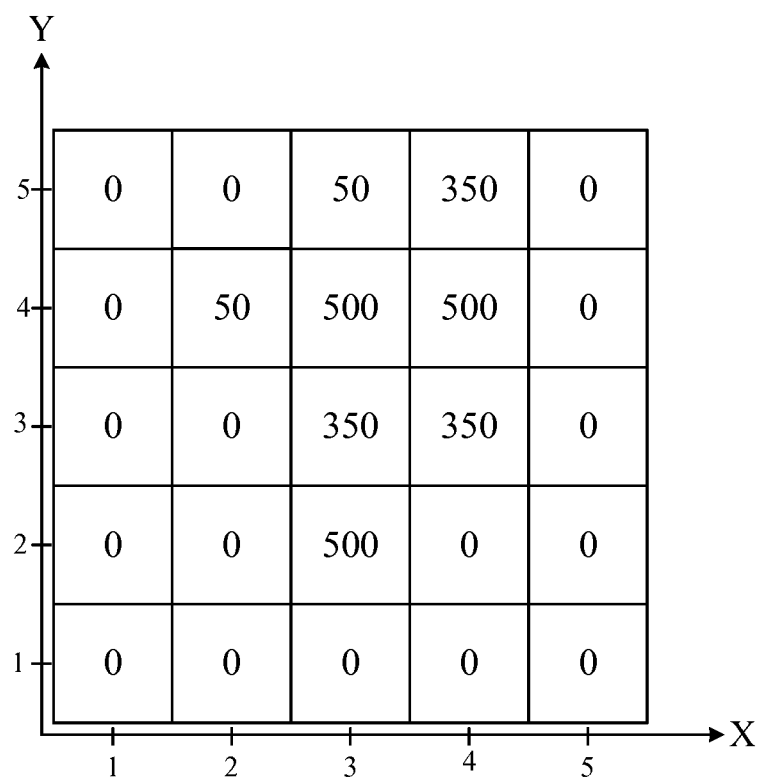

When the position of one of the self-capacitive electrodes in one self-capacitive electrode group and the position of the independent self-capacitive electrodes adjacent thereto are touched, the position of one independent self-capacitive electrode is touched, and the position of one of self-capacitive electrodes in another self-capacitive electrode group is touched, positions (3, 3) and (3, 4), (4, 3) and (4, 4) as shown in FIG. 12a are touched, according to the above assumption, capacitances of the self-capacitive electrodes 11 located on the respective positions in FIG. 12a are shown in FIG. 12b.

1. The capacitance values of the self-capacitive electrodes 11 located on the respective positions in FIG. 12b are compared with 220 (the first predetermined capacitance value); since the capacitance values of self-capacitive electrodes 11 located on positions (3, 2), (3, 3), (3, 4), (4, 3), (4, 4) and (4, 5) are greater than 220, the positions (3, 2), (3, 3), (3, 4), (4, 3), (4, 4) and (4, 5) are determined as first positions.

2. For each of the first positions:

According to the capacitance values of the self-capacitive electrodes 11 located on the four adjacent positions of the upper, lower, left and right sides of the position (3, 2), it can be determined that there are three positions on which the self-capacitive electrodes 11 have the capacitance value smaller than 25 (the second predetermined capacitance value), among the four adjacent positions of the upper, lower, left and right sides of the position (3, 2), so the position (3, 2) is a ghost point position.

According to the capacitance values of the self-capacitive electrodes 11 located on the four adjacent positions of the upper, lower, left and right sides of the position (3, 3), it can be determined that there is only one position on which the self-capacitive electrode 11 has the capacitance value smaller than 25 (the second predetermined capacitance value), among the four adjacent positions of the upper, lower, left and right sides of the position (3, 3), so the position (3, 3) is not a ghost point position.

According to the capacitance values of the self-capacitive electrodes 11 located on the four adjacent positions of the upper, lower, left and right sides of the position (3, 4), it can be determined that the capacitance values of the self-capacitive electrodes 11 located on all the four adjacent positions of the upper, lower, left and right sides of the position (3, 4) are greater than 25 (the second predetermined capacitance value), so the position (3, 4) is not a ghost point position.

According to the capacitance values of the self-capacitive electrodes 11 located on the four adjacent positions of the upper, lower, left and right sides of the position (4, 3), it can be determined that there are two positions on which the self-capacitive electrodes 11 have the capacitance value smaller than 25 (the second predetermined capacitance value), among the four adjacent positions of the upper, lower, left and right sides of the position (4, 3), so the position (4, 3) is a ghost point position.

According to the capacitance values of the self-capacitive electrodes 11 located on the four adjacent positions of the upper, lower, left and right sides of the position (4, 4), it can be determined that there is only one position on which the self-capacitive electrode 11 has the capacitance value smaller than 25 (the second predetermined capacitance value), among the four adjacent positions of the upper, lower, left and right sides of the position (4, 4), so the position (4, 4) is not a ghost point position.

According to the capacitance values of the self-capacitive electrodes 11 located on the four adjacent positions of the upper, lower, left and right sides of the position (4, 5), it can be determined that there are two positions on which the self-capacitive electrodes 11 have the capacitance value smaller than 25 (the second predetermined capacitance value), among the four adjacent positions of the upper, lower, left and right sides of the position (4, 5), so the position (4, 5) is a ghost point position.

Therefore, only the positions (3, 2) and (4, 5) of the first positions are the ghost point positions.

3. The ghost point positions (3, 2) and (4, 5) are removed from the first positions (3, 2), (3, 3), (3, 4), (4, 3), (4, 4) and (4, 5), so the remaining positions (3, 3), (3, 4), (4, 3) and (4, 4) are the touch positions.

For example, in the embodiment, when the touch panel is touched, the capacitances of self-capacitive electrodes located on respective positions are estimated values based on the assumption, which is just to better illustrate the touch positioning method of the present invention, and is not as a limitation to the present invention.

The above-described embodiments are to illustrate the touch positioning method provided by the embodiment of the present invention with respect to a few cases of touch point position, it can be seen from the embodiments that, the touch positioning method provided by the embodiment of the present invention can carry out both single-touch positioning and multi-point touch positioning.

Further, a touch method for a touch panel having self-capacitive electrode groups including more than two self-capacitive electrodes has the same principle as the above embodiments, which will be not repeated here.

For example, the touch method provided by the embodiment of the present invention is more applicable to single-touch for a touch panel having self-capacitive electrode groups including more than two self-capacitive electrodes.

Figure 13:
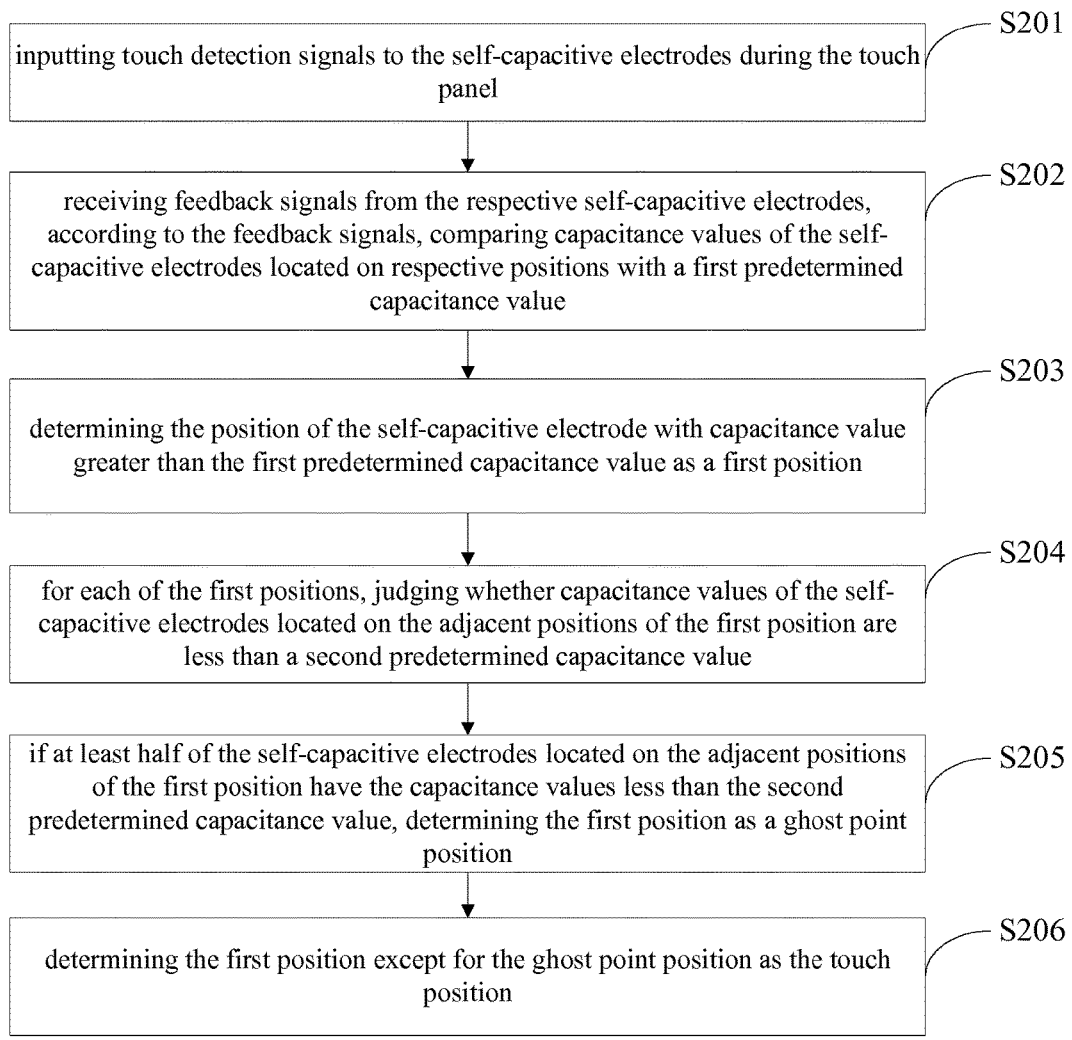
FIG. 13 is a flowchart of a touch positioning method of a touch panel provided by an embodiment of the present invention.

Based on the same inventive concept, for a touch panel in which the self-capacitive electrodes located on all adjacent positions of the respective self-capacitive electrodes in the respective self-capacitive electrode groups are independent self-capacitive electrodes, e.g., the touch panel shown in FIG. 3f, the embodiment of the present invention further provides a touch positioning method for the touch panel, as shown in FIG. 13, comprising steps of:

S201: inputting touch detecting signals to self-capacitive electrodes in the touch panel;

S202: receiving feedback signals from the respective self-capacitive electrodes, and according to the feedback signals, comparing capacitance values of the self-capacitive electrodes located on respective positions with a first predetermined capacitance value;

S203: determining the position of the self-capacitive electrode whose capacitance value is greater than the first predetermined capacitance value as a first position;

S204: for each of the first positions, judging whether capacitance values of the self-capacitive electrodes located on adjacent positions of the first position are less than a second preset capacitance value;

S205: if at least half of the self-capacitive electrodes located on the adjacent positions of the first position have the capacitance values less than the second preset capacitance value, determining the first position as a ghost point position;

S206: determining the first position except for the ghost point as the touch position.

For the touch positioning method shown in FIG. 13, the principle is the same as that of the touch positioning method shown in FIG. 6, but the number of the self-capacitive electrodes located on adjacent positions to be judged when determining a ghost point position will be increased; taking FIG. 8a for example, the self-capacitive electrode in each of the self-capacitive electrode groups has eight adjacent positions, so it is needed to judge eight positions, while it is only needed to judge four adjacent positions on the upper, lower, left and right sides among the eight adjacent positions in FIG. 6, and the other steps are the same, which will be not repeated here.

Based on the same inventive concept, an embodiment of the present invention further provides a display device, comprising any touch panel provided by the embodiment of the present invention, and the display device can be: a mobile phone, a watch, a tablet personal computer, a television, a monitor, a laptop computer, a digital photo border, a navigator, and any other product or component having a display function. The implementation of the display device can refer to embodiments of the touch panel, which will not be repeated here.

For the touch panel, the touch positioning method thereof and the display device provided by the embodiments of the present invention, in the touch panel, the plurality of self-capacitive electrodes are divided into several self-capacitive electrode groups independent of each other and several independent self-capacitive electrodes; each of the self-capacitive electrode groups includes at least two self-capacitive electrodes not adjacent to each other, and the respective self-capacitive electrodes in the same self-capacitive electrode group are electrically connected with the touch chip through the same wire; and, for example, at least self-capacitive electrodes located on the four adjacent positions of the upper, lower, left and right sides of the respective self-capacitive electrodes in the respective self-capacitive electrode groups are independent self-capacitive electrodes. Therefore, as compared with that one self-capacitive electrode is usually electrically connected with the touch chip through one wire, the wires for electrically connecting the self-capacitive electrode with the touch chip can be reduced, and thus the lead-out wires in the touch panel and the wiring terminals of the touch chip are reduced.

The foregoing embodiments merely are exemplary embodiments of the present invention, and not intended to define the protective scope of the present invention, and the protective scope of the present invention is determined by the appended claims.

The present application claims priority of Chinese Patent Application No. 201410484054.X filed on Sep. 19, 2014, the disclosure of which is incorporated herein by reference in its entirety as part of the present application.

What is claimed is:

1. A touch panel, comprising a base substrate, a plurality of self-capacitive electrodes arranged in a column direction and a row direction perpendicular to the column direction and located on the base substrate, and a touch chip for determining a touch position by detecting changes in capacitance values of the respective self-capacitive electrodes during a touch period;

wherein, the plurality of self-capacitive electrodes are divided into several self-capacitive electrode groups independent of each other and several independent self-capacitive electrodes;

each of the independent self-capacitive electrodes is one of the self-capacitive electrodes respectively, and the respective independent self-capacitive electrodes are electrically connected with the touch chip through different wires;

each of the self-capacitive electrode groups includes at least two self-capacitive electrodes not adjacent to each other, and the respective self-capacitive electrodes in a same self-capacitive electrode group are electrically connected with the touch chip through a same wire, and any two of the self-capacitive electrodes in the self-capacitive electrode groups are not adjacent to each other in both the column direction and the row direction.

2. The touch panel according to claim 1, wherein, each of the self-capacitive electrode groups includes at least two self-capacitive electrodes not adjacent to each other along the column direction or the row direction.

3. The touch panel according to claim 2, wherein, the respective self-capacitive electrodes in a same self-capacitive electrode group are separated from each other by one independent self-capacitive electrode.

4. The touch panel according to claim 2, wherein, each of the self-capacitive electrode groups consists of two of the self-capacitive electrodes.

5. The touch panel according to claim 2, wherein, the self-capacitive electrodes located on the four adjacent positions of the upper, lower, left and right sides of the respective independent self-capacitive electrodes are the self-capacitive electrodes in the self-capacitive electrode groups.

6. The touch panel according to claim 1, wherein, the respective self-capacitive electrodes in a same self-capacitive electrode group are separated from each other by one independent self-capacitive electrode.

7. The touch panel according to claim 6, wherein, each of the self-capacitive electrode groups consists of two of the self-capacitive electrodes.

8. The touch panel according to claim 6, wherein, any two of the independent self-capacitive electrodes are not adjacent to each other in both the column direction and the row direction.

9. The touch panel according to claim 1, wherein, each of the self-capacitive electrode groups consists of two of the self-capacitive electrodes.

10. The touch panel according to claim 1, wherein, any two of the independent self-capacitive electrodes are not adjacent to each other in both the column direction and the row direction.

11. The touch panel according to claim 1, wherein, the self-capacitive electrodes located on all the adjacent positions of the respective self-capacitive electrodes in the respective self-capacitive electrode groups are the independent self-capacitive electrodes.

12. The touch panel according to claim 1, wherein, the respective self-capacitive electrodes are formed by segmenting a common electrode layer arranged on the base substrate;

the touch chip is further used for loading common electrode signals to respective self-capacitive electrodes during a display period.

13. The touch panel according to claim 1, wherein, opposite side edges of two adjacent self-capacitive electrodes are fold lines.

14. The touch panel according to claim 13, wherein, the opposite side edges of the two adjacent self-capacitive electrodes which are fold lines have step-like structures having consistent shapes and matching each other.

15. The touch panel according to claim 13, wherein, the opposite side edges of the two adjacent self-capacitive electrodes which are fold lines have concave-convex structures having consistent shapes and matching each other.

16. The touch panel according to claim 1, wherein, the touch panel is an add-on touch panel, an on-cell touch panel, or an in-cell touch panel.

17. The touch panel according to claim 1, wherein, the touch panel is a liquid crystal display screen or an organic light-emitting display screen.

18. A display device, comprising the touch panel according to claim 1.

19. A touch positioning method of a touch panel, wherein, the touch panel comprises a base substrate, a plurality of self-capacitive electrodes arranged in matrix and located on the base substrate, and a touch chip for determining a touch position by detecting changes in capacitance values of the respective self-capacitive electrodes during a touch period;

wherein, the plurality of self-capacitive electrodes are divided into several self-capacitive electrode groups independent of each other and several independent self-capacitive electrodes;

each of the independent self-capacitive electrodes is one of the self-capacitive electrodes respectively, and the respective independent self-capacitive electrodes are electrically connected with the touch chip through different wires;

each of the self-capacitive electrode groups includes at least two self-capacitive electrodes not adjacent to each other, and the respective self-capacitive electrodes in a same self-capacitive electrode group are electrically connected with the touch chip through a same wire, and at least the self-capacitive electrodes located on the four adjacent positions of upper, lower, left and right sides of the respective self-capacitive electrodes in the respective self-capacitive electrode groups are the independent self-capacitive electrodes, the touch positioning method comprises:

inputting touch detection signals to the self-capacitive electrodes in the touch panel;

receiving feedback signals from the respective self-capacitive electrodes, and according to the feedback signals, comparing capacitance values of the self-capacitive electrodes located on respective positions with a first predetermined capacitance value, and determining the position of the self-capacitive electrode with capacitance value greater than the first predetermined capacitance value as a first position;

for each of the first positions, judging whether capacitance values of the self-capacitive electrodes located on the four adjacent positions of upper, lower, left and right sides of the first position are less than a second predetermined capacitance value;

if at least two of the self-capacitive electrodes located on the four adjacent positions of the upper, lower, left and right sides of the first position have the capacitance values less than the second predetermined capacitance value, determining the first position as a ghost point position;

determining the first position except for the ghost point position as the touch position.

20. A touch positioning method of the touch panel, wherein, the touch panel comprises a base substrate, a plurality of self-capacitive electrodes arranged in matrix and located on the base substrate, and a touch chip for determining a touch position by detecting changes in capacitance values of the respective self-capacitive electrodes during a touch period;

wherein, the plurality of self-capacitive electrodes are divided into several self-capacitive electrode groups independent of each other and several independent self-capacitive electrodes;

each of the independent self-capacitive electrodes is one of the self-capacitive electrodes respectively, and the respective independent self-capacitive electrodes are electrically connected with the touch chip through different wires;

each of the self-capacitive electrode groups includes at least two self-capacitive electrodes not adjacent to each other, and the respective self-capacitive electrodes in a same self-capacitive electrode group are electrically connected with the touch chip through a same wire, and at least the self-capacitive electrodes located on the four adjacent positions of upper, lower, left and right sides of the respective self-capacitive electrodes in the respective self-capacitive electrode groups are the independent self-capacitive electrodes, wherein, the self-capacitive electrodes located on all the adjacent positions of the respective self-capacitive electrodes in the respective self-capacitive electrode groups are the independent self-capacitive electrodes, wherein, the touch positioning method comprises:

inputting touch detection signals to the self-capacitive electrodes during the touch panel;

receiving feedback signals from the respective self-capacitive electrodes, according to the feedback signals, comparing capacitance values of the self-capacitive electrodes located on respective positions with a first predetermined capacitance value, and determining the position of the self-capacitive electrode with capacitance value greater than the first predetermined capacitance value as a first position;

for each of the first positions, judging whether capacitance values of the self-capacitive electrodes located on the adjacent positions of the first position are less than a second predetermined capacitance value;

if at least half of the self-capacitive electrodes located on the adjacent positions of the first position have the capacitance values less than the second predetermined capacitance value, determining the first position as a ghost point position;

determining the first position except for the ghost point position as the touch position.

* * * * *